(12) United States Patent
Horie

(10) Patent No.: US 7,977,682 B2
(45) Date of Patent: Jul. 12, 2011

(54) LIGHT EMITTING DEVICE

(75) Inventor: Hideyoshi Horie, Ibaraki-ken (JP)

(73) Assignee: Mitsubishi Chemical Corporation, Tokyo (JP)

( * ) Notice: Subject to any disclaimer, the term of this patent is extended or adjusted under 35 U.S.C. 154(b) by 372 days.

(21) Appl. No.: 12/278,798

(22) PCT Filed: Jan. 26, 2007

(86) PCT No.: PCT/JP2007/051258
§ 371 (c)(1),
(2), (4) Date: Aug. 8, 2008

(87) PCT Pub. No.: WO2007/091432
PCT Pub. Date: Aug. 16, 2007

(65) Prior Publication Data
US 2010/0163895 A1    Jul. 1, 2010

(30) Foreign Application Priority Data
Feb. 8, 2006  (JP) .................... 2006-031295

(51) Int. Cl.
*H01L 33/00* (2010.01)
(52) U.S. Cl. ................ 257/79; 257/80; 257/81
(58) Field of Classification Search ......... 257/79, 257/80, 81
See application file for complete search history.

(56) References Cited

U.S. PATENT DOCUMENTS

| | | | |
|---|---|---|---|
| 5,847,413 A * | 12/1998 | Yamazaki et al. | 257/69 |
| 6,436,773 B1 * | 8/2002 | Yu | 438/284 |
| 6,521,914 B2 * | 2/2003 | Krames et al. | 257/81 |
| 6,678,307 B2 * | 1/2004 | Ezaki et al. | 372/96 |
| 6,777,805 B2 * | 8/2004 | Uemura et al. | 257/745 |

(Continued)

FOREIGN PATENT DOCUMENTS

JP    56 33891    4/1981

(Continued)

OTHER PUBLICATIONS

U.S. Appl. No. 12/299,253, filed Oct. 31, 2009, Horie.

(Continued)

*Primary Examiner* — N Drew Richards
*Assistant Examiner* — Robert Carpenter
(74) *Attorney, Agent, or Firm* — Oblon, Spivak, McClelland, Maier & Neustadt, L.L.P.

(57) ABSTRACT

Provided is a compound light emitting device which facilitates easy connection of power supply lines, and has a high emission intensity in-plane uniformity. The light emitting device includes a first-conduction-type cladding layer, active layer structure, and second-conduction-type cladding layer each containing a III-V compound semiconductor. The first-conduction-type cladding layer and second-conduction-type cladding layer sandwich the active layer structure. The light emitting device includes a first-conduction-type-side electrode (7) for injecting carriers into the first-conduction-type cladding layer, and a second-conduction-type-side electrode (6) for injecting carriers into the second-conduction-type cladding layer. The first-conduction-type-side electrode (7) has an opening (7$p$). The second-conduction-type-side electrode (6) has a main-electrode-portion (6-0) partially surrounded by the first-conduction-type-side electrode (7), and extracting portions (6-1, 6-2) for extracting the main-electrode-portion (6-0) outside the first-conduction-type-side electrode (7) though the opening (7$p$). The main-electrode-portion (6-0) is a part of a constant-width figure. The interval between the outer edge of the main-electrode-portion (6-0) and the inner edge of the first-conduction-type-side electrode (7) is almost constant.

20 Claims, 15 Drawing Sheets

U.S. PATENT DOCUMENTS

| | | | |
|---|---|---|---|
| 6,825,502 B2 * | 11/2004 | Okazaki et al. | 257/98 |
| 6,885,036 B2 * | 4/2005 | Tarsa et al. | 257/99 |
| 7,084,432 B2 * | 8/2006 | Kachi et al. | 257/81 |
| 7,109,525 B2 * | 9/2006 | Yen et al. | 257/91 |
| 7,193,358 B2 * | 3/2007 | Yamada et al. | 313/502 |
| 7,537,976 B2 * | 5/2009 | Hirose | 438/149 |
| 2003/0063649 A1 * | 4/2003 | Ezaki et al. | 372/96 |
| 2004/0016932 A1 * | 1/2004 | Kondo | 257/80 |
| 2004/0041160 A1 * | 3/2004 | Zhao et al. | 257/79 |
| 2005/0128408 A1 * | 6/2005 | Lee | 349/141 |
| 2005/0201439 A1 | 9/2005 | Horie | |
| 2007/0212807 A1 * | 9/2007 | Yamada et al. | 438/99 |

FOREIGN PATENT DOCUMENTS

| | | |
|---|---|---|
| JP | 10 209496 | 8/1998 |
| JP | 11 150303 | 6/1999 |
| JP | 3136672 | 12/2000 |
| JP | 3244010 | 10/2001 |
| JP | 2002 26384 | 1/2002 |
| JP | 2002 319705 | 10/2002 |
| JP | 2003 115611 | 4/2003 |
| JP | 2004 31669 | 1/2004 |

OTHER PUBLICATIONS

U.S. Appl. No. 12/299,318, filed Nov. 3, 2008, Horie.

U.S. Appl. No. 12/299,250, filed Oct. 31, 2008, Horie.

* cited by examiner a-a' SECTION

MAIN LIGHT EXTRACTING DIRECTION b-b' SECTION

⇓

MAIN LIGHT EXTRACTING DIRECTION

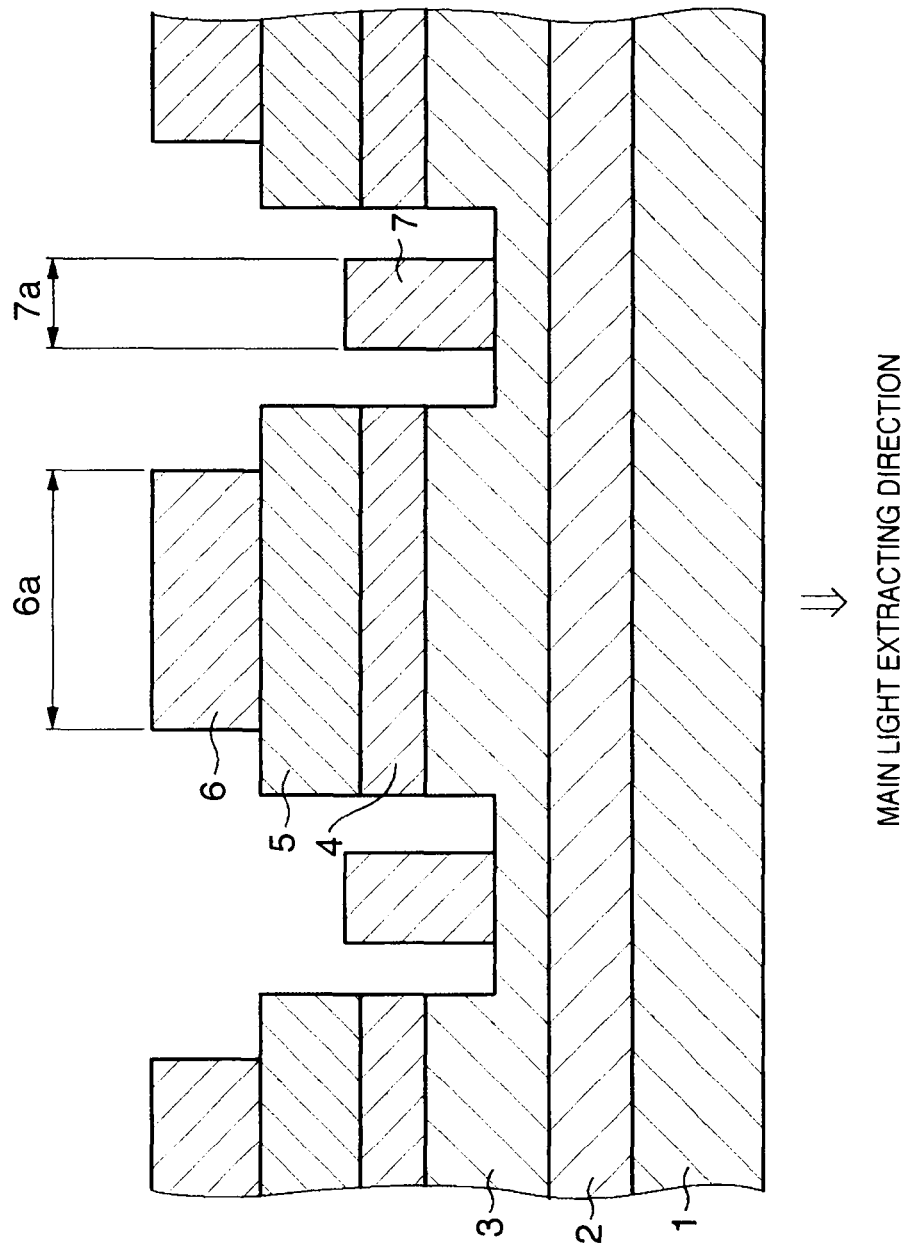

LIGHT EMITTING DEVICE

TECHNICAL FIELD

The present invention relates to a compound semiconductor light emitting device and, more particularly, to a light emitting device which has a first-conduction-type cladding layer, active layer structure, and a second-conduction-type cladding layer each containing a III-V compound semiconductor, and in which the first-conduction-type cladding layer and the second-conduction-type cladding layer sandwich the active layer structure.

BACKGROUND ART

Light emitting devices using III-V compound semiconductors are known. Examples are a red light emitting device made of an AlGaAs-based material or AlGaInP-based material formed on a GaAs substrate, an orange or yellow light emitting device made of a GaAsP-based material formed on a GaP substrate, and an infrared light emitting device made of an InGaAsP-based material formed on an InP substrate.

Light emitting devices are classified into, for example, a light emitting diode (LED) using spontaneous emission light, and a laser diode (LD) or semiconductor laser having an optical feedback function for extracting stimulated emission light. Light emitting devices can be used as, for example, a display device, communication device, high-density optical recording light source device, high-accuracy optical processing device, and medical device.

Particularly from the 1990s, high-efficiency blue and green LEDs using $In_xAl_yGa_{(1-x-y)}N$-based, III-V compound semiconductors ($0 \leq x \leq 1$, $0 \leq y \leq 1$, and $0 \leq x+y \leq 1$) containing nitrogen as a group-V element have been realized.

In addition, an LED having a high efficiency even in an ultraviolet region has been realized by the later research and development, and a blue LD has also been put on the market.

Increasing the output and efficiency of particularly the ultraviolet or blue LED has a large industrial significance. A white LED can be realized by integrating the high-output, high-efficiency blue or ultraviolet LED with a phosphor. The white LED is regarded as promising in illuminating applications.

To increase the output, that is, to improve the total radiant flux of a light emitting device, it is essential to increase the size of the light emitting device and secure a high robustness against a high input power. Also, a large-area light emitting device has the emission characteristics of an area source, and is particularly suitable for illuminating applications.

In a light emitting device obtained by simply increasing the area of an ordinary small-sized light emitting device while maintaining its structure, it is difficult to make uniform the emission intensity in the entire light emitting region.

Various attempts have been made to increase the in-plane uniformity of the emission intensity of a light emitting device. For example, attempts to increase the in-plane uniformity of the emission intensity of a single light emitting device are disclosed in patent references 1 to 4. Each of patent references 1 to 4 has disclosed a light emitting device having a structure in which one electrode (an outer electrode) completely surrounds the whole circumferential surface of the other electrode (an inner electrode).

On the other hand, to provide area light sources, patent references 5 to 7 have disclosed light emitting devices in each of which a plurality of light emitting portions are arranged on one substrate.

Patent reference 1: Japanese Patent No. 3,136,672
Patent reference 2: Japanese Patent No. 3,244,010
Patent reference 3: Japanese Patent Laid-Open No. 2002-319705
Patent reference 4: Japanese Patent Laid-Open No. 10-209496
Patent reference 5: Japanese Patent Laid-Open No. 11-150303
Patent reference 6: Japanese Patent Laid-Open No. 2002-26384
Patent reference 7: Japanese Patent Laid-Open No. 2003-115611

DISCLOSURE OF INVENTION

Problems that the Invention is to Solve

In the light emitting device described in patent reference 1, one electrode completely surrounds the other electrode, so the inter-electrode distance is almost uniform. Therefore, sufficiently even light emission is expected if the size of the whole device is as small as about 350 µm. When further increasing the size of the device, however, it is difficult to uniformly inject carriers into the entire active layer. As a consequence, non-uniform light emission is achieved. Also, the light emitting device described in patent reference 1 is essentially unsuited to flip chip mounting that is effective in increasing the output, since one electrode completely surrounds the other electrode. For example, when the light emitting device is mounted on a heat sink block by flip chip mounting, an approach to the central electrode always intersects the peripheral electrode portion. This requires three-dimensional connection. Three-dimensional connection reduces the sectional area of a connection formed by a metal material between the electrode and a lead, and decreases the efficiency of heat radiation from the light emitting device to the heat sink block, thereby making the output difficult to increase.

In patent reference 2, if the size of the device is increased as a similar figure, the width of the electrode changes from one place to another. This makes it difficult to obtain uniform light emission as the size of the device increases.

The structures described in patent references 3 and 4 are also essentially unsuitable for flip chip mounting, which is effective in increasing the output, since one electrode completely surrounds the other electrode. For example, when the device is mounted on a heat sink block by flip chip mounting, an approach to the electrode in the central portion always intersects the peripheral electrode portion, and the problems as described above arise.

Furthermore, patent references 1 to 4 have not disclosed any idea of increasing the overall dimensions of the light emitting device by arranging a plurality of light emitting portions.

Patent references 5 to 7 have disclosed the light emitting devices in order to provide area light sources. However, patent references 5 to 7 are irrelevant to making uniform emission intensity in each individual light emitting portion for providing the area light source.

It is an object of the present invention to provide a light emitting device which is advantageous in increasing the area of a light emitting region, increasing the in-plane uniformity of the emission intensity, and improving the heat radiation properties.

Means of Solving the Problems

A light emitting device according to the first aspect of the present invention has a first-conduction-type cladding layer, an active layer structure, and a second-conduction-type cladding layer each containing a III-V compound semiconductor, and the active layer structure is sandwiched between the first-conduction-type cladding layer and the second-conduction-type cladding layer. The light emitting device comprises a first-conduction-type-side electrode configured to inject carriers into the first-conduction-type cladding layer, and a second-conduction-type-side electrode configured to inject carriers into the second-conduction-type cladding layer. The first-conduction-type-side electrode has an opening. The second-conduction-type-side electrode has a main-electrode portion partially surrounded by the first-conduction-type-side electrode, and an extracting-portion configured to extract the main-electrode portion outside the first-conduction-type-side electrode through the opening. The main-electrode portion is a part of a curve of constant width, and the distance between the outer edge of the main-electrode portion and the inner edge of the first-conduction-type-side electrode is almost constant.

In a preferred embodiment of the present invention, the active layer structure, the second-conduction-type cladding layer, and the second-conduction-type-side electrode can be arranged on a surface of the first-conduction-type cladding layer in a first direction, and the first-conduction-type-side electrode can be formed on the surface of the first-conduction-type cladding layer in the first direction to partially surround the active layer structure, the second-conduction-type cladding layer, and the second-conduction-type-side electrode.

In a preferred embodiment of the present invention, the light emitting device can further comprise a supporting plate. The supporting plate can support one of the two surfaces, from which the first-conduction-type-side electrode and the second-conduction-type-side electrode are exposed, of a structure including the first-conduction-type cladding layer, the active layer structure, the second-conduction-type cladding layer, the first-conduction-type-side electrode, and the second-conduction-type-side electrode.

In a preferred embodiment of the present invention, the curve of constant width can include a circle and a Reuleaux polygon (e.g., a Reuleaux triangle).

In a preferred embodiment of the present invention, assuming W be the width of the main-electrode portion, W preferably satisfies $$400 \, \mu m \leq W \leq 2500 \, \mu m \quad (6)$$

In a preferred embodiment of the present invention, the extracting-portion can include a portion that narrows toward the main-electrode portion.

In a preferred embodiment of the present invention, the extracting-portion can include a rectangular portion.

In a preferred embodiment of the present invention, assuming W be the width of the main-electrode portion and $L_1$ be the width of a portion where the main-electrode portion and extracting-portion are in contact with each other, W and $L_1$ preferably satisfy $$W/20 \leq L_1 \leq W \quad (7)$$

In a preferred embodiment of the present invention, assuming $L_2$ be the outer edge length of a portion of the second-conduction-type-side electrode which is surrounded by the first-conduction-type-side electrode, and $L_3$ be the outer edge length of a portion of the second-conduction-type-side electrode which is a part of the curve of constant width, $L_2$ and $L_3$ preferably satisfy $$L_2/2 \leq L_3 \leq L_2 \quad (8)$$

In a preferred embodiment of the present invention, assuming x be the distance between the outer edge of the main-electrode portion and the inner edge of the first-conduction-type-side electrode, x preferably satisfies $$3 \, \mu m \leq x \leq 500 \, \mu m \quad (9)$$

In a preferred embodiment of the present invention, the main-electrode portion preferably comprises a plurality of main-electrode portions.

In a preferred embodiment of the present invention, the peripheral portion of the second-conduction-type-side electrode is preferably covered with an insulator.

In a preferred embodiment of the present invention, the first-conduction-type-side electrode is preferably configured to inject carriers into the first-conduction-type cladding layer through an opening formed in an insulator.

In a preferred embodiment of the present invention, the insulator favorably contains at least one material selected from the group consisting of $SiO_x$, $AlO_x$, $TiO_x$, $TaO_x$, $HfO_x$, $ZrO_x$, $SiN_x$, $AlN_x$, $AlF_x$, $BaF_x$, $CaF_x$, $SrF_x$, and $MgF_x$.

In a preferred embodiment of the present invention, the insulator can comprise a plurality of layers.

In a preferred embodiment of the present invention, the first-conduction-type cladding layer, the active layer structure, and the second-conduction-type cladding layer each desirably contain an element selected from the group consisting of In, Ga, Al, B, and N.

In a preferred embodiment of the present invention, the active layer structure favorably comprises a quantum well layer and a barrier layer, and, assuming B be the number of barrier layers and W be the number of quantum well layers, B and W preferably satisfy $$B = W + 1 \quad (10)$$

In a preferred embodiment of the present invention, the light emitting device can further comprise a first-conduction-type contact layer between the first-conduction-type cladding layer and the first-conduction-type-side electrode.

In a preferred embodiment of the present invention, the light emitting device can further comprise a second-conduction-type contact layer between the second-conduction-type cladding layer and the second-conduction-type-side electrode.

In a preferred embodiment of the present invention, the first-conduction-type cladding layer desirably comprises an n-type semiconductor layer, and the second-conduction-type cladding layer desirably comprises a p-type semiconductor layer.

A light emitting device according to the second aspect of the present invention has a first-conduction-type cladding layer, an active layer structure, and a second-conduction-type cladding layer each containing a III-V compound semiconductor, and the active layer structure is located between the first-conduction-type cladding layer and the second-conduction-type cladding layer. The light emitting device comprises a first-conduction-type-side electrode configured to inject carriers into the first-conduction-type cladding layer, and a second-conduction-type-side electrode configured to inject carriers into the second-conduction-type cladding layer, the first-conduction-type-side electrode has an opening, the second-conduction-type-side electrode has a main-electrode portion partially surrounded by the first-conduction-type-side electrode, and an extracting-portion configured to extract the main-electrode portion outside the first-conduction-type-side electrode through the opening, and the extracting-portion includes a first extracting-portion extending through the opening, and a second extracting-portion formed along a part of the outer edge of the first-conduction-type-side electrode.

A light emitting device according to the third aspect of the present invention has a first-conduction-type cladding layer, an active layer structure, and a second-conduction-type cladding layer each containing a III-V compound semiconductor, and the active layer structure is sandwiched between the first-conduction-type cladding layer and second-conduction-type cladding layer. The light emitting device comprises a first-conduction-type-side electrode configured to inject carriers into the first-conduction-type cladding layer, and a second-conduction-type-side electrode configured to inject carriers into the second-conduction-type cladding layer, the first-conduction-type-side electrode includes a straight portion having an outer edge formed by straight lines, and has an opening in an almost central portion of the straight portion, and the second-conduction-type-side electrode has a main-electrode portion partially surrounded by the first-conduction-type-side electrode, and an extracting portion configured to extract the main-electrode portion outside the first-conduction-type-side electrode through the opening.

Effects of the Invention

The present invention can provide a light emitting device advantageous in increasing the area of a light emitting region, increasing the in-plane uniformity of the emission intensity, and improving the heat radiation properties.

BRIEF DESCRIPTION OF DRAWINGS

FIG. 9A is an exemplary sectional view taken along a line aa' in FIG. 7A;

EXPLANATION OF REFERENCE NUMERALS

Figure 1:
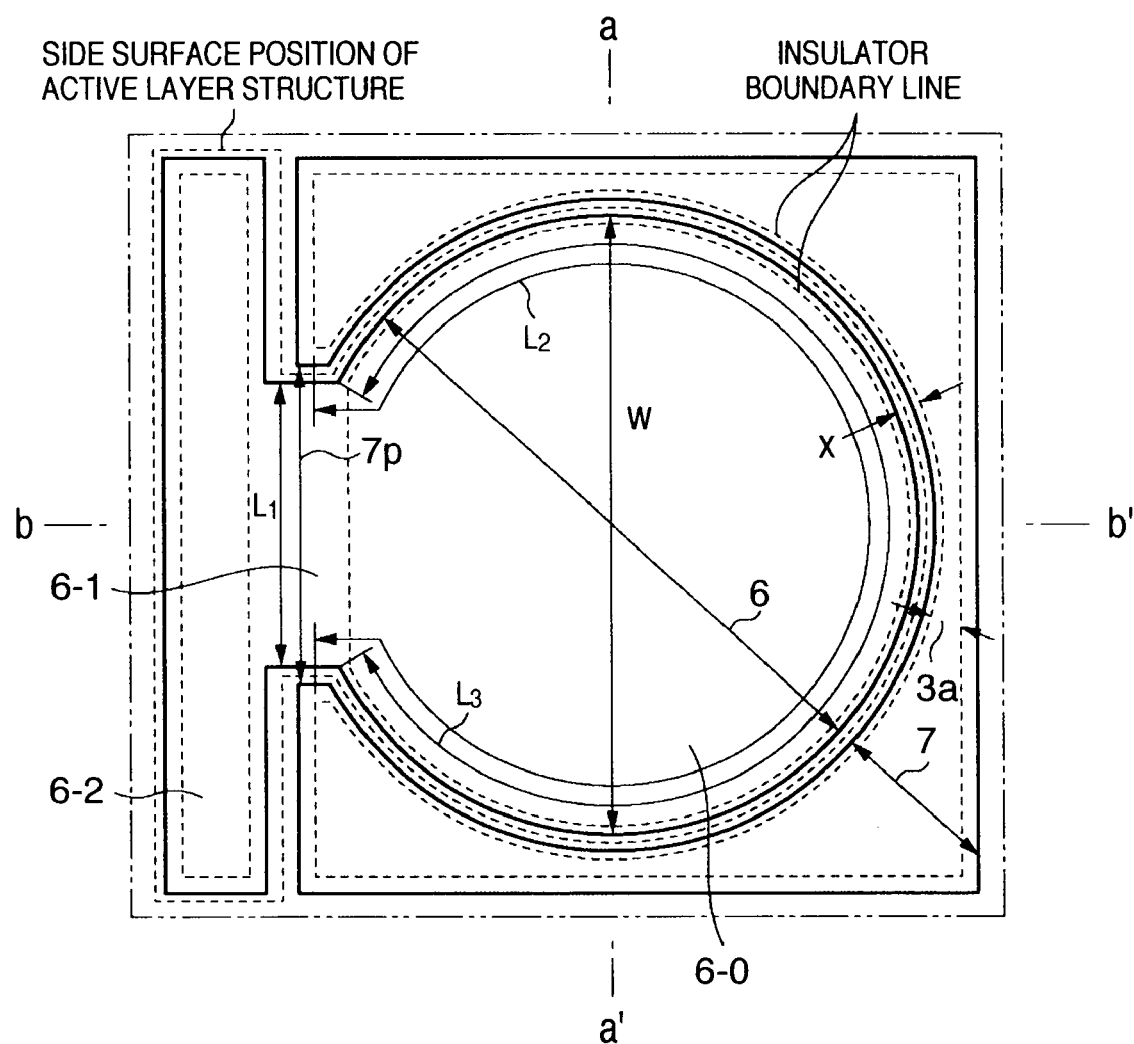
FIG. 1 is a plane view showing the structure of a compound semiconductor light emitting device of the first embodiment of the present invention.

1 . . . substrate
2 . . . buffer layer
3 . . . first-conduction-type cladding layer
3m . . . protuberant portion
3o . . . peripheral portion
3s . . . sidewall
4 . . . active layer structure
5 . . . second-conduction-type cladding layer
6 . . . second-conduction-type-side electrode
6-0 . . . main-electrode-portion
6-1 . . . first extracting-portion
6-2 . . . second extracting-portion
6a . . . second-carrier-injecting-region
7 . . . first-conduction-type-side electrode
7a . . . first-carrier-injecting-region
7p . . . opening (cut portion)
8 . . . insulator

BEST MODE FOR CARRYING OUT THE INVENTION

The present invention relates to a III-V compound semiconductor light emitting device and, more particularly, to a light emitting device which has a first-conduction-type cladding layer, an active layer structure, and second-conduction-type cladding layer each containing a III-V compound semiconductor, and in which the active layer structure is sandwiched between the first-conduction-type cladding layer and second-conduction-type cladding layer. The III-V compound semiconductor is preferably a compound semiconductor containing N (nitrogen) as a group-V device, that is, a GaN (gallium nitride)-based material.

In this specification, the explanation of the shape and dimensions of an electrode for injecting carriers into a cladding layer relates to the shape and dimensions of that region of the whole section of the electrode, which functions to inject carriers into the cladding layer, if the whole section of the electrode does not function to inject carriers into the cladding layer. For example, in an electrode formed to fill an opening formed in an insulator, not the whole section but a portion of the section which comes in direct contact with a cladding layer through the opening or comes in indirect contact with the cladding layer through the opening via another layer contributes to the injection of carriers into the cladding layer. Therefore, the explanation of the shape and dimensions of the electrode is the explanation of the shape and dimensions of the contact portion, that is, the carrier-injecting-region. Note that the widest region of an electrode is sometimes the same as the carrier-injecting-region. In the following explanation, the carrier-injecting-region will also be described in each section in order to prevent misunderstanding. However, the explanation of the shape and dimensions of an electrode should be interpreted as described above, regardless of the presence/absence of the description of the carrier-injecting-region.

In this specification, a description expressing the positional relationship between objects such as layers, members, and structures, for example, the description that an object is placed on another object means not only a positional relationship by which the two objects are in contact, but also a positional relationship by which the two objects are not in contact (e.g., a state in which still another object or space is interposed between the two objects), unless otherwise specified.

In this specification, an epitaxially grown layer can include a layer having undergone certain processing, for example, a carrier activation process using annealing, charged particles, a plasma, or the like, after epitaxial growth.

In this specification, letting nx be the refractive index of each of n sorts of materials forming a layer and $t_x$ (x is 1 to n) be the physical thickness of the material, an average refractive index $n_{av}$ of the layer is given by $$n_{av} = (n_1 \times t_1 + n_2 \times t_2 + \ldots + n_n \times t_n)/(t_1 + t_2 + \ldots + t_n) \quad (11)$$

The structures of compound semiconductor light emitting devices and methods of fabricating the same according to preferred embodiments of the present invention will be explained in detail below with reference to the accompanying drawings.

FIGS. 1 to 5 are plan views showing the structures of compound semiconductor light emitting devices of five preferred embodiments of the present invention. Typically, in the light emitting devices of the preferred embodiments of the present invention, the back side of the drawing surface of each of FIGS. 1 to 5 can be a main light extracting direction. Note that FIGS. 3 to 5 each illustrate only the electrode shape of the light emitting device. FIG. 6A is an exemplary sectional view taken along a line aa' in FIGS. 1 and 2. FIG. 6B is an exemplary sectional view taken along a line bb' in FIG. 1. FIG. 6C is a view exemplarily showing an active layer structure suited to the embodiments shown in FIGS. 1 to 5. Note that the main object of these drawings is to explain characteristic elements of the invention. Therefore, each drawing exemplarily shows the positional relationship between objects such as layers, members, and structures, and is not an enlarged view of the structure of an actually manufacturable light emitting device.

The semiconductor light emitting devices of the preferred embodiments of the present invention can contain a compound semiconductor. This compound semiconductor can include a III-V compound semiconductor containing a nitrogen atom as a group-V element. A substrate 1 can be made of a material that transmits the wavelength band of light generated by the light emitting device (or can be made of a transparent material). Typically, the substrate 1 is preferably made of a material by which the light output from the light emitting device does not decrease by 50% or more by absorption by the substrate 1.

The substrate 1 is preferably an insulating substrate. When an insulating substrate is used as the substrate 1, the function of the light emitting device does not deteriorate even if a conductive material such as solder adheres to the substrate 1 when the light emitting device is mounted on a support by flip chip mounting. More specifically, when epitaxially growing a GaN-, InGaN-, AlGaN-, or InAlGaN-based light emitting material or InAlBGaN-based material on the substrate 1, the substrate 1 is preferably made of a material selected from the group consisting of sapphire, SiC, GaN, LiGaO$_2$, ZnO, and ScAlMgO$_4$, and most preferably, sapphire.

The substrate 1 can be not only a just substrate completely determined by a so-called crystal plane index, but also a so-called off-angle substrate (miss-oriented substrate) in order to control the crystallinity during epitaxial growth. The off-angle substrate has the effect of promoting favorable crystal growth in a step-flow mode, and hence has the effect of improving the morphology of the device. Accordingly, the off-angle substrate is widely used as a substrate. For example, when using a sapphire c+ plane substrate as a substrate for crystal growth of a GaN-based material, it is desirable to use a plane inclining about 0.2° in the m+ direction. A substrate having a fine inclination angle of about 0.1° to 0.2° is generally widely used as the off-angle substrate. In a GaN-based material formed on sapphire, however, a relatively large off angle may also be made in order to cancel out an electric field applied by the piezoelectric effect on a quantum well layer as a light emitting point in the active layer structure.

The substrate 1 may also be, for example, chemically etched or annealed beforehand in order to fabricate a compound semiconductor light emitting device by using the crystal growth technique such as MOCVD or MBE. In addition, the surface of the substrate 1 may also be intentionally patterned. This makes it possible to suppress the introduction of threading dislocation generated in the interface between the substrate 1 and an epitaxial layer formed on it to the active layer structure or its vicinity of the light emitting device.

The substrate 1 may also be removed during the fabrication process of a light emitting device. For example, when mounting the light emitting device on a support by flip chip mounting, the substrate 1 can be lifted off from the whole structure. When the substrate 1 is thus removed, processing for improving the device characteristics can be performed on a buffer layer 2.

Of the two surfaces of the buffer layer 2, the surface from which the substrate 1 is peeled off is often a nitrogen surface when the buffer layer 2 is made of a GaN-based material. The nitrogen surface can be processed, for example, roughened more easily than a sapphire substrate or Ga surface.

Furthermore, the thickness of the substrate 1 is typically set at about 350 to 700 μm in the initial stages of the fabrication process of the light emitting device, thereby ensuring a high mechanical strength required in the process. When not removing but leaving the substrate 1 behind in the light emitting device structure, the substrate 1 is thinned in a polishing step during a series of processes. The thickness of the substrate 1 is preferably about 100 μm in the final light emitting device.

When mounting the light emitting device on a support by flip chip mounting, one of the two surfaces of the substrate 1 on which no epitaxial growth is performed is the main light extracting direction. Assuming that this surface is called a light extracting surface, the light extracting surface is favorably an unflat surface or a roughened surface. When the light extracting surface is an unflat surface or a roughened surface, light emitted in the quantum well layer(s) can be extracted at a high efficiency. This is favorable in increasing the output and efficiency of the device.

When removing the substrate 1, the exposed surface of the buffer layer 2 is preferably an unflat surface or a roughened surface.

When epitaxially growing cladding layers and an active layer structure on the substrate 1, the buffer layer 2 can be formed between the substrate 1 and the cladding layer in order to, for example, suppress dislocation, reduce the incompleteness of the substrate crystal, and reduce various types of mutual mismatching between the substrate crystal and epitaxially grown layers.

The buffer layer 2 is particularly important during heteroepitaxial growth on the substrate 1, a material selected from the group consisting of an InAlGaN-based material, InAlBGaN-based material, InGaN-based material, AlGaN-based material, and GaN-based material, because the lattice constants of the epitaxially grown layer and substrate 1 do not match.

In the process of epitaxially growing a layer on the buffer layer 2 by metal organic vapor phase epitaxy (MOVPE), it is favorable to use, as the buffer layer 2, an AlN layer grown at a low temperature of about 600° C. or a GaN layer grown at a low temperature of about 500° C. AlN, GaN, AlGaN, InAlGaN, or InAlBGaN grown at a high temperature of about 800° C. to 1,000° is also suitable as the buffer layer 2. The thickness of a buffer layer like this is generally as small as about 5 to 40 nm.

The buffer layer 2 does not need to be a single layer. To further improve the crystallinity, a GaN layer about a few μm thick grown at a temperature of about 1,000° C. without any doping may also be formed on a GaN buffer layer grown at a low temperature. In practice, a thick buffer layer like this is normally formed, and the thickness is, for example, about 0.5 to 7 μm.

The buffer layer 2 may also be formed by using ELO (Epitaxial Lateral Overgrowth) as a kind of so-called microchannel epitaxy. This makes it possible to largely reduce the density of threading dislocation occurring between a substrate such as sapphire and an InAlGaN-based material.

When removing the substrate 1 from the main structure including an active layer structure 4 during the fabrication process, the surface of the buffer layer 2 exposed by the removal is the main light extracting surface. For example, the substrate 1 can be removed by photochemically decomposing a portion of the buffer layer 2 by using light having a wavelength that is transmitted through the substrate 1 and absorbed by the buffer layer 2. For example, when the substrate 1 is made of sapphire and the buffer layer 2 is made of GaN, the substrate 1 can be removed from the main structure including the active layer structure 4 by decomposing GaN into Ga and N by irradiating a 248-nm excimer laser beam to the buffer layer 2 through the substrate 1.

A first-conduction-type cladding layer 3 sandwiches the active layer structure 4 together with a second-conduction-type cladding layer 5, thereby efficiently spatially entrapping carriers and light, and achieving highly efficient light emission in the quantum well layer. For this purpose, a first-conduction-type cladding layer 3 is generally made of a material having a refractive index lower than the average refractive index of the active layer structure 4, and a bandgap larger than the average bandgap of the active layer structure 4.

In addition, the first-conduction-type cladding layer 3 is preferably made of a material serving as a so-called, type I band lineup in the relationship with particularly a barrier layer 4b in the active layer structure 4. Based on these guidelines, the material of the first-conduction-type cladding layer 3 can be appropriately selected in accordance with the substrate 1, buffer layer 2, and active layer structure 4 selected to achieve a desired emission wavelength.

When using C+ plane sapphire as the substrate 1 and GaN grown at a low temperature as the buffer layer 2, the first-conduction-type cladding layer 3 can be made of a GaN-based material, AlGaN-based material, AlGaInN-based material, or InAlBGaN-based material, or have a multilayered structure containing all or some of these materials.

The lower limit of the carrier concentration in the first-conduction-type cladding layer 3 is preferably $1 \times 10^{17}$ cm$^{-3}$ or more, more preferably $5 \times 10^{17}$ cm$^{-3}$ or more. The upper limit of the carrier concentration in the first-conduction-type cladding layer 3 is preferably $1 \times 10^{19}$ cm$^{-3}$ or less, more preferably $7 \times 10^{18}$ cm$^{-3}$ or less, and most preferably $5 \times 10^{18}$ cm$^{-3}$ or less.

When the first-conduction-type is an n-type, the dopant of the first-conduction-type cladding layer 3 is most favorably Si. The doping level described above is important to allow the whole light emitting device to emit light at a uniform luminance.

As shown in FIGS. 6A and 6B, the first-conduction-type cladding layer 3 can be formed as a single layer or a stacked structure including two or more layers. In the latter case, for example, the first layer can be made of a GaN-based material, and the second layer can be made of a material selected from the group consisting of an AlGaN-based material, InAlGaN-based material, and InAlBGaN-based material. The first-conduction-type cladding layer 3 may also have a superlattice structure that is a stacked structure of different types of materials. Furthermore, the carrier concentration may also be changed in the first-conduction-type cladding layer 3.

When the first-conduction-type cladding layer 3 has a multilayered structure, it is desirable to reduce the contact resistance with respect to a first-conduction-type-side electrode 7 by intentionally raising the carrier concentration in a layer in contact with the electrode 7.

The first-conduction-type cladding layer 3 has a protuberant portion (mesa portion) 3m. The protuberant portion 3m can be formed by, for example, forming a first-conduction-type layer having an almost uniform thickness, and etching a portion surrounding a region to be turned into the protuberant portion 3m. Sidewalls 3s of the protuberant portion 3m and a peripheral portion 3o surrounding the protuberant portion 3m are preferably covered with an insulator 8 such as SiN, except for a first-carrier-injecting-region 7a. An opening formed in the insulator 8 defines the first-carrier-injecting-region 7a where the first-conduction-type-side electrode 7 injects carriers into the first-conduction-type cladding layer 3.

The active layer structure 4 is formed on the first-conduction-type cladding layer 3. The active layer structure 4 can include one or a plurality of quantum well layers 4w in which electrons and holes (or holes and electrons) injected from the first-conduction-type cladding layer 3 and second-conduction-type cladding layer 5 recombine to emit light, and a plurality of barrier layers 4b. The barrier layers 4b are formed between the quantum well layers 4w, between the quantum well layer 4w and first-conduction-type cladding layer 3, and between the quantum well layer 4w and second-conduction-type cladding layer 5.

Assuming W to be the number of the quantum well layers 4w and B to be the number of the barrier layers 4b in the active layer structure 4, W and B desirably satisfy equation (12) in order to increase the output and efficiency of the light emitting device.

$$B = W + 1 \qquad (12)$$

That is, the stacked structure of the cladding layers 3 and 5 and active layer structure 4 is preferably made up of the first-conduction-type cladding layer 3/active layer structure 4/second-conduction-type cladding layer 5, and the active layer structure 4 is preferably made up of the barrier layer 4b/quantum well layer 4w/ . . . /quantum well layer 4w/barrier layer 4b, such as the barrier layer 4b/quantum well layer 4w/barrier layer 4b or the barrier layer 4b/quantum well layer 4w/barrier layer 4b/quantum well layer 4w/barrier layer 4b. FIG. 6C shows an example of the active layer structure 4 having the structure as described above. In this example shown in FIG. 6C, the number of the quantum well layers 4w is five, and that of the barrier layers 4b is six.

To achieve the quantum size effect and increase the emission efficiency in the quantum well layer 4w, the layer thickness is decreased to be equivalent to the de Broglie wavelength. To increase the output, therefore, it is favorable not to use a single quantum well layer but to stack a plurality of quantum well layers. In this case, the barrier layers 4b space the quantum well layers 4w apart from each other while controlling bonding between them. The existence of the barrier layers 4b is desirable in order to space the cladding layers 3 and 5 apart from the quantum well layers 4 was well.

For example, when the first-conduction-type cladding layer 3 and second-conduction-type cladding layer 5 contain AlGaN and the quantum well layer 4w is made of InGaN, the barrier layer 4b made of GaN preferably exists between AlGaN and InGaN. The placement of the barrier layer 4b like this facilitates changing the temperature in the series of processes if the optimum temperature of crystal growth of the quantum well layer 4w differs from that of the cladding layers 3 and 5. Accordingly, the barrier layer 4b is favorable from the viewpoint of epitaxial growth control as well.

Also, when the first-conduction-type cladding layer 3 and second-conduction-type cladding layer are made of InAlGaN having the widest bandgap and the quantum well layer 4w is made of InAlGaN having the narrowest bandgap, InAlGaN having an intermediate bandgap is preferably used as the barrier layer 4b.

Furthermore, the difference between the bandgap of the cladding layers 3 and 5 and that of the quantum well layer 4w is generally larger than the bandgap difference between the barrier layer 4b and quantum well layer 4w. When the efficiency of the injection of carriers into the quantum well layer 4w is taken into consideration, therefore, the quantum well layer 4w is desirably not in direct contact with the cladding layers 3 and 5.

No intentional doping is preferably performed on the quantum well layer 4w. On the other hand, the overall resistance of the active layer structure is preferably decreased by performing doping on the barrier layer 4b. An n-type dopant, particularly, Si is favorably doped in the barrier layer 4b. Since Mg useful as a p-type dopant easily diffuses in a device, it is important to suppress the diffusion of Mg during a high-output operation. Si is effective to suppress the diffusion of Mg. However, no doping is desirably performed in the interface between the quantum well layer 4w and barrier layer 4b.

The sidewalls of the active layer structure 4 are preferably covered with the insulator 8. This is so because it is possible to prevent a shortcircuit caused by the adhesion of solder or the like to the sidewalls of the active layer structure 4 when mounting the light emitting device by flip chip bonding.

The active layer structure 4 is formed between the first-conduction-type cladding layer 3 and second-conduction-type cladding layer 5. This makes it possible to spatially confine carriers and light in the active layer structure 4, thereby achieving high-efficiency light emission in the quantum well layer 4w.

For this purpose, the second-conduction-type cladding layer 5 is preferably made of a material having a refractive index lower than the average refractive index of the active layer structure 4, and a bandgap larger than the average bandgap of the active layer structure 4. In addition, the second-conduction-type cladding layer 5 is preferably made of a material serving as a so-called, type I band lineup in the relationship with particularly the barrier layer 4b in the active layer structure 4. Based on these guidelines, the material of the second-conduction-type cladding layer 5 can be appropriately selected in accordance with the substrate 1, buffer layer 2, and active layer structure 4 selected to achieve a desired emission wavelength.

For example, when using C+plane sapphire as the substrate 1 and GaN as the buffer layer 2, the second-conduction-type cladding layer 5 can be made of a GaN-based material, AlGaN-based material, AlGaInN-based material, or AlGaBInN-based material, or have a multilayered structure including all or some of these materials. The first-conduction-type cladding layer 3 and second-conduction-type cladding layer 5 may also be made of the same material.

The lower limit of the carrier concentration in the second-conduction-type cladding layer 5 is preferably $1 \times 10^{17}$ cm$^{-3}$ or more, more preferably $5 \times 10^{17}$ cm$^{-3}$ or more. The upper limit of the carrier concentration in the second-conduction-type cladding layer 5 is preferably $7 \times 10^{18}$ cm$^{-3}$ or less, and most preferably $2 \times 10^{18}$ cm$^{-3}$ or less. When the second-conduction-type is a p-type, the dopant is most favorably Mg. These doping levels are important because they are elements for determining the series resistance that is important to allow the whole light emitting device to emit light at a uniform intensity.

The second-conduction-type cladding layer 5 can be formed as a single layer or a stacked structure including two or more layers. In this case, it is possible to use, for example, a GaN-based material and AlGaN-based material. The second-conduction-type cladding layer 5 may also have a superlattice structure that is a stacked structure of different types of materials. Furthermore, the carrier concentration may also be changed in the second-conduction-type cladding layer 5.

When the n-type dopant is Si and the p-type dopant is Mg in a GaN-based material, the crystallinities of p-type GaN, p-type AlGaN, and p-type AlInGaN are generally inferior to those of n-type GaN, n-type AlGaN, and n-type AlInGaN, respectively. When forming the device, therefore, the p-type cladding layer inferior in crystallinity is desirably formed after the crystal of the active layer structure 4 is grown. From this point of view, the first-conduction-type is preferably an n-type, and the second-conduction-type is preferably a p-type.

When mounting the light emitting device by flip chip mounting, the thickness of the p-type cladding layer (corresponding to the second-conduction-type cladding layer 5 of the preferred embodiment) inferior in crystallinity can be smaller than that when mounting the light emitting device by face-up mounting. In flip chip mounting, the side of the first-conduction-type cladding layer 3 is the main light extracting direction, and the extraction of light from the side of the second-conduction-type-side electrode 6 need not be taken into consideration, so the second-conduction-type-side electrode 6 having a large area and large thickness can be formed. When using flip chip mounting, therefore, it is unnecessary to expect lateral carrier diffusion in the second-conduction-type cladding layer 5, unlike when using face-up mounting. However, the carrier injection efficiency decreases if the second-conduction-type cladding layer 5 is extremely thinned. Accordingly, the thickness of the second-conduction-type cladding layer is, for example, preferably 0.02 to 0.3 μm, more preferably 0.03 to 0.15 μm, and most preferably 0.04 to 0.1 μm.

When the second-conduction-type cladding layer 5 has a multilayered structure, the contact resistance with respect to the second-conduction-type-side electrode 6 is preferably decreased by intentionally raising the carrier concentration in a layer in contact with the electrode 6.

The second-conduction-type cladding layer 5 is desirably covered with the insulator 8 except for a portion where the second-conduction-type-side electrode 6 is formed. When the insulator 8 is formed after the second-conduction-type-side electrode 6 is formed on the second-conduction-type cladding layer 5, the section of the second-conduction-type-side electrode 6 matches a second-carrier-injecting-region 6a.

The process of forming the structure shown in FIGS. 6A, 6B, and 6C includes steps of forming epitaxial layers on the substrate 1. The epitaxial layers can include the buffer layer 2, the first-conduction-type cladding layer 3, the active layer structure 4 including the stacked structure of the quantum well layers 4w and barrier layers 4b, and the second-conduction-type cladding layer 5. Note that the epitaxial layers may also include another layer.

The epitaxial layers are preferably formed by MOCVD. However, the epitaxial layers may also be formed by MBE, PLD, or sputtering. It is also possible to form an epitaxial layer having a multilayered structure by using at least two of various methods such as MOCVD, MBE, PLD, and sputtering. The arrangement of the epitaxial layers can appropriately be changed in accordance with, for example, the application of the light emitting device.

When the second-conduction-type cladding layer 5 is a p-type compound semiconductor layer (e.g., a p-type GaN layer), the second-conduction-type-side electrode 6 is preferably formed after the formation (including annealing and the like after the second-conduction-type cladding layer 5 is grown) of the second-conduction-type cladding layer 5, and before the formation of the insulator 8 and first-conduction-type-side electrode 7.

For example, the activation ratio of a GaN-based material doped to have a p-type is lower than that of a GaN-based material doped to have an n-type. When using a p-type compound semiconductor layer, for example, a p-type GaN-based semiconductor layer as the second-conduction-type cladding layer 5, the hole concentration in the p-type GaN-based cladding layer can decrease owing to the process damage if the layer is exposed to various processes. For example, if the step of forming the insulator 8 is performed using p-CVD before the formation of the second-conduction-type-side electrode 6, the surface of the second-conduction-type cladding layer 5 suffers the plasma damage.

After the second-conduction-type cladding layer 5 is formed, therefore, the second-conduction-type-side electrode 6 is preferably formed before other processes. The other processes herein mentioned can include, for example, the step of forming the protuberant portion 3m by etching a portion of the second-conduction-type cladding layer 5, a portion of the active layer structure 4, and a portion of the first-conduction-type cladding layer 3, the step of forming, in the insulator 8, an opening that defines the first-carrier-injecting-region (contact region) 7a, and the step of forming the first-conduction-type-side electrode 7.

When the second-conduction-type cladding layer 5 is a p-type, the surface of the second-conduction-type-side electrode can be made of Au. When the surface of the second-conduction-type-side electrode 6 is made of a relatively stable metal such as Au, the process damage applied to the surface by the later process is small. Judging from this point of views, the second-conduction-type cladding layer 5 is formed, then, the process of forming the second-conduction-type-side electrode 6 is preferably performed before other processes as much as possible.

Note that when forming another layer, for example, a second-conduction-type contact layer on the second-conduction-type cladding layer 5 and forming the second-conduction-type-side electrode 6 on this second-conduction-type contact layer, a layer that undergoes the process damage is the second-conduction-type contact layer. In short, the process of forming the second-conduction-type-side electrode 6 on the uppermost surface layer of the epitaxial layers is desirably performed before other processes as much as possible.

The second-conduction-type-side electrode 6 should provide a good ohmic contact with a second-conduction-type nitride compound semiconductor, and, when performing flip chip mounting, should function as a reflecting mirror in the emission wavelength band and provide good adhesion to, for example, a submount such as a soldering material or a device supporting substrate. The material and structure of the second-conduction-type-side electrode 6 can be determined from these points of view. Although the second-conduction-type-side electrode 6 can be made up of a single layer or a plurality of layers, it is typically made up of a plurality of layers in order to provide a plurality of functions as described above.

When the second-conduction-type is a p-type and one of the two surfaces of the second-conduction-type cladding layer 5, which faces the second-conduction-type-side electrode 6, is made of GaN, the second-conduction-type-side electrode 6 is preferably made of a material selected from the group consisting of Ni, Pt, Pd, Mo, and Au. In particular, the first layer (in contact with the second-conduction-type cladding layer 5) of the second-conduction-type-side electrode 6 is favorably an Ni layer, and the final layer (farthest from the second-conduction-type cladding layer 5) of the second-conduction-type-side electrode 6 is favorably an Au layer. Ni has an absolute value of large work function and is suited to a junction with a p-type material, and Au has a high resistance to the process history and is suitable for mounting.

The second-conduction-type-side electrode 6 can be formed by using various film formation techniques such as sputtering and vacuum evaporation. Also, as a technique for forming the electrode 6 having a desired shape, it is possible to apply, for example, lift-off using photolithography or place-selective vapor deposition using a metal mask or the like.

After the second-conduction-type-side electrode 6 is formed, the peripheral portion 3o of the region where the protuberant portion 3m is to be formed is etched so as to form the protuberant portion 3m on the first-conduction-type cladding layer 3. In this step, the peripheral portions 3o of the second-conduction-type cladding layer 5, active layer structure 4, and first-conduction-type cladding layer are successively etched. If a second-conduction-type contact layer is formed on the second-conduction-type cladding layer 5, this contact layer is also etched.

The method of etching is preferably dry etching which is employing, for example, $Cl_2$, $SiCl_4$, or $BCl_3$ as an etching gas after an etching mask is formed using $SiN_x$ or the like.

The second-conduction-type-side electrode 6 is applied the fabrication hysterisis of an $SiN_x$ mask deposited by p-CVD or the like, and is applied a step of removing the $SiN_x$ mask performed after the etching step. When the surface of the second-conduction-type-side electrode 6 is made of a stable metal such as Au, however, the process damage applied to the second-conduction-type-side electrode is small.

Following the above-mentioned etching step, it is also possible to perform, for example, an additional etching step (second etching step) of forming element-separation-trenches in the substrate 1.

After the peripheral portion (recessed portion) 3o of the first-conduction-type cladding layer 3 is etched, the insulator 8 is formed on the entire surface of the structure on the substrate 1. When the light emitting device is mounted on a support by flip chip mounting, the insulator 8 prevents a soldering material or conductive paste material for mounting from shortcircuiting, for example, the first-conduction-type-side electrode 7 and second-conduction-type-side electrode 6, or the active layer structure 4 and electrode 7 or 6.

Although the material or structure of the insulator 8 is not particularly limited, the insulator 8 is preferably made of a single-layered oxide, nitride, or fluoride. More specifically, the insulator 8 is preferably made of a material selected from the group consisting of $SiO_x$, $AlO_x$, $TiO_x$ $TaO_x$, $HfO_x$, $ZrO_x$, $SiN_x$, $AlN_x$, $AlF_x$, $BaF_x$, $CaF_x$, $SrF_x$, and $MgF_x$. The insulator 8 made of any of these materials stably provides insulating properties for long-term periods.

On the other hand, it is also possible to adopt the insulator 8 having a multilayered structure. In this case, the function of a so-called, high-reflection coating having an optically relatively high reflectivity to light generated in the light emitting device can also be provided by appropriately adjusting the refractive indices of a plurality of insulators (dielectric materials) forming the insulator 8. For example, when the center emission wavelength of the light emitting device is $\lambda$, a high reflectivity can be obtained by stacking $SiO_x$ and $TiO_x$ such that the optical thickness of each layer is $\lambda/4n$ (where n is the refractive index of each material at the wavelength $\lambda$).

This makes it possible to raise the efficiency of the extraction of light in the main extracting direction when mounting the light emitting device on a support by flip chip bonding. Accordingly, it is possible to increase the output and efficiency of the device and prevent, for example, an unexpected shortcircuit caused by a soldering material or the like at the same time. More specifically, assuming R1 to be the reflectivity of the insulator 8 and R2 to be the reflectivity of the buffer layer 2 at the emission wavelength of the light emitting device, R1 and R2 favorably satisfy R2<R1. This is the condition for allowing the insulator 8 having a multilayered structure to efficiently function as an optical reflecting mirror.

Layers forming the insulator 8 having a multilayered structure preferably contain a material selected from the group consisting of $SiO_x$, $SiN_x$, $TiO_x$, and $MgF_2$ from the viewpoints of the material stability and the refractive index range.

Following the step of forming the insulator 8, an opening is preferably formed in the insulator 8 so as to expose a portion of the second-conduction-type-side electrode 6. In this step, it is favorable to simultaneously remove the insulator 8 so as to expose the carrier-injecting-region 7a of the first-conduction-type cladding layer 3. When formed by this process, the shape of the second-carrier-injecting-region 6a becomes equal to the sectional shape of the second-conduction-type-side electrode 6. In addition, the shape of the first-carrier-injecting-region 7a is defined by the opening formed in the insulator 8 to bring the first-conduction-type-side electrode 7 and first-conduction-type cladding layer 3 into contact with each other. However, the shapes of the first-conduction-type-side electrode 7 and first-carrier-injecting-region 7a are desirably similar to each other.

The insulator 8 on the second-conduction-type-side electrode 6 is preferably removed such that the peripheral portion of the second-conduction-type-side electrode 6 is kept covered with the insulator 8. That is, the surface area of the exposed portion of the second-conduction-type-side electrode 6 is preferably smaller than the area of the second-carrier-injecting-region 6a. In this case, it is possible to effectively prevent an unexpected shortcircuit, for example, a shortcircuit between the first-conduction-type-side electrode 7 and second-conduction-type-side electrode 6, or a shortcircuit between light emitting elements, caused by a soldering material or the like used when mounting the light emitting device by flip chip mounting and integrating it with a submount, device supporting substrate, or the like.

The second-conduction-type-side electrode 6 preferably contains, as a constituent element, at least one material selected from the group consisting of Ni, Pt, Pd, Mo, and Au. In particular, the surface in contact with the insulator 8 is desirably made of Au. In this case, the second-conduction-type-side electrode 6 suffers the process damage little in the step of removing the insulator 8. Accordingly, the step of forming the second-conduction-type-side electrode 6 is preferably performed before the step of forming the insulator 8.

Furthermore, it is preferable to form the exposed portion of the second-conduction-type-side electrode 6, remove the insulator 8 to expose the first-carrier-injecting-region 7a, or, when forming element-separation-trenches for dividing the light emitting device, form the element-separation-trenches in the insulator 8 at the same time.

When partially removing the insulator 8, it is possible to select various etching methods such as dry etching and wet etching, etching gases, and etchant in accordance with the material of the insulator 8. When the insulator 8 is a single $SiN_x$ layer, for example, it is possible to perform dry etching using an etching gas such as $SF_6$ or wet etching using a hydrofluoric acid-based etchant. When the insulator 8 has a multilayered structure made of $SiO_x$ and $TiO_x$, the multilayered film in a desired portion can be removed by Ar ion milling.

The state shown in FIGS. 6A and 6B is completed by forming the first-conduction-type-side electrode 7 after the opening for defining the first-carrier-injecting-region 7a is formed in the insulator 8. The first-conduction-type-side electrode 7 is desirably made of a material that provides a good ohmic contact with a first-conduction-type nitride compound semiconductor. Also, the first-conduction-type-side electrode 7 is preferably made of a material that functions as a reflecting mirror in a favorable emission wavelength band when using flip chip mounting, and provides good adhesion to, for example, a submount made of a soldering material or the like, or to a device supporting substrate. The first-conduction-type-side electrode 7 can be made up of a single layer or a plurality of layers. Typically, the first-conduction-type-side electrode 7 can be made up of a plurality of layers in order to achieve a plurality of purposes required of the electrode.

When the first-conduction-type is an n-type, the first-conduction-type-side electrode 7 in contact with it preferably contains, as a constituent element, at least one material selected from the group consisting of Ti, Al, and Mo. Each of these metals has a small absolute value of work function, and hence is suitable for a junction with an n-type material. When the first-conduction-type-side electrode 7 is made up of a plurality of layers, the final layer (farthest from the first-conduction-type cladding layer 3) is favorably made of Al.

The first-conduction-type-side electrode 7 preferably has an area larger than the size of the first-carrier-injecting-region 7a. This makes it possible to prevent the misalignment of the first-conduction-type-side electrode 7 with respect to the opening formed in the insulator 8 in order to define the carrier-injecting-region 7a, and improve the properties of heat radiation (the heat transfer amount) from the first-conduction-type-side electrode 7 to a submount when performing flip chip mounting. Also, the first-conduction-type-side electrode 7 is desirably formed so as not to spatially overlap the second-conduction-type-side electrode 6. This makes it possible to reduce the possibility of a shortcircuit caused between the first-conduction-type-side electrode 7 and second-conduction-type-side electrode 6 by a soldering material or the like when performing flip chip mounting.

The first-conduction-type-side electrode 7 can be formed by using various film formation techniques such as sputtering and vacuum evaporation. Also, as a technique for forming the electrode 7 having a desired shape, it is possible to apply, for example, lift-off using photolithography or place-selective vapor deposition using a metal mask or the like.

The first-conduction-type-side electrode 7 can form the first-carrier-injecting-region 7a in contact with the first-conduction-type cladding layer 3. However, the first-conduction-type-side electrode 7 may also inject carriers into the first-conduction-type cladding layer 3 via a first-conduction-type contact layer. In short, the first-conduction-type-side electrode 7 only need to be formed to be able to inject carriers into the first-conduction-type cladding layer 3.

The electrode shapes and the like of the light emitting devices and devices of the preferred embodiments of the present invention will be explained below with reference to FIGS. 1 to 6A and 6B. First, one embodiment will be explained with reference to FIGS. 1, 6A, and 6B.

The light emitting device of the preferred embodiment of the present invention has a first-conduction-type-side electrode 7 and second-conduction-type-side electrode 6. The second-conduction-type-side electrode 6 has a main-electrode portion 6-0, first-extracting-portion 6-1, and second-extracting-portion 6-2. The main-electrode-portion 6-0 is a region partially surrounded by the first-conduction-type-side electrode 7. The first-extracting-portion 6-1 is a region for extracting the main-electrode-portion 6-0 outside the first-conduction-type-side electrode 7. The second-extracting-portion 6-2 is a region formed along a part of the outer edge of the first-conduction-type-side electrode 7. When arranging a plurality of main-electrode-portions 6-0, the second-extracting-portions 6-2 can function to connect the main-electrode-portions 6-0.

The first-conduction-type-side electrode 7 surrounds the main-electrode-portion 6-0 of the second-conduction-type-side electrode 6, and has an opening (cut portion) 7p as a portion not surrounding the main-electrode-portion 6-0. The first-conduction-type-side electrode 7 can include a straight portion having an outer edge formed by straight lines, and can have the opening 7p in an almost central portion of this straight portion.

The first-extracting-portion 6-1 of the second-conduction-type-side electrode 6 extracts the main-electrode-portion 6-0 outside the first-conduction-type-side electrode 7 through the opening 7p of the first-conduction-type-side electrode 7, and further extracts the main-electrode-portion 6-0 to the second-extracting-portion 6-2 formed outside the first-conduction-type-side electrode 7. The second-extracting-portion 6-2 can also function as a power supply line.

The main-electrode-portion 6-0 can have the shape of a curve of constant width or a constant-width figure such as a circle except for a portion deformed by the existence of the first-extracting-portion 6-1. The outer edge of the main-electrode-portion 6-0 and the inner edge of a first-carrier-injecting-region 7a of the first-conduction-type-side electrode 7 surrounding the main-electrode-portion 6-0 desirably have a predetermined width. That is, the inner edge of the first-carrier-injecting-region 7a surrounding the portion of curve of constant width (constant-width figure) of the main-electrode-portion 6-0 is also preferably a similar curve of constant width (constant-width figure) having the same center as that of the curve of constant width (constant-width figure) portion of the main-electrode-portion 6-0.

The reason why the main-electrode-portion 6-0 and first-conduction-type-side electrode 7 are similar curve of constant width (constant-width figures) having the same center will be explained in detail below.

Assume that the first-conduction-type is an n-type and the second-conduction-type is a p-type. The light emitting device of the preferred embodiment of the present invention can principally be made of a III-V compound semiconductor containing a nitrogen (N) atom as a group-V element. When a compound semiconductor light emitting device is fabricated by using, for example, a GaN-based, AlN-based, InN-based, InGaN-based, AlGaN-based, InAlN-based, InAlGaN-based, or InAlBGaN-based material, light emission from a region near the electrode of a p-type semiconductor layer is stronger than that from a region near the electrode of an n-type semiconductor layer. In this case, if a carrier-injecting-region (the electrode) exceeds a certain size with respect to the p-type semiconductor layer, the intensity of emission from the region near the electrode of the p-type semiconductor becomes non-uniform.

By contrast, when the shape of the carrier-injecting-region for injecting carriers into the p-type semiconductor layer is a curve of constant width (constant-width figure) such as a circle or Reuleaux polygon, the decrease in in-plane un-uniformity of the emission intensity. Particularly, the decrease in emission intensity in the central portion and its vicinity of the carrier-injecting-region is suppressed even if the size of the carrier-injecting-region or electrode shape is increased, compared to the case where the shape of the carrier-injecting-region is a non-constant-width figure such as a triangle, quadrangle, pentagon, or another polygon.

When the inner edge of the region for injecting carriers into the n-type semiconductor layer is formed to have a predetermined width x with respect to the outer edge of the region for injecting carriers into the p-type semiconductor layer, it is possible to uniformly emit light from the vicinity of the electrode of the p-type semiconductor layer even if the size of the region for injecting carriers into the p-type semiconductor layer is increased.

In other words, in a device structure having a relatively large figures of curve of non-constant width (non-constant-width figure) as the shape of a p-type-side electrode or carrier-injecting-region, light emission from the vicinity, particularly, the center of the p-type semiconductor electrode is weak. By contrast, when the shape of the p-type-side carrier-injecting-region for injecting carriers into the p-type semiconductor layer is a curve of constant width (constant-width figure) such as a circle or Reuleaux polygon, and when the inner edge of the region for injecting carriers into the n-type semiconductor layer is formed to have an appropriate predetermined width x with respect to the outer edge of the region for injecting carriers into the p-type semiconductor layer, light emission from the vicinity, particularly, the center of the electrode of the p-type semiconductor layer is not weakened, so it is possible to uniformly emit light from the vicinity of the electrode of the p-type semiconductor layer.

Referring to FIGS. 1, 6A, and 6B, the main-electrode-portion 6-0 for injecting carriers into a p-type cladding layer 5 can have the shape of a curve of constant width (a constant-width figure) except for the portion deformed by the existence of the first-extracting-portion 6-1 as described previously. Also, the first-conduction-type-side electrode 7 (carrier-injecting-region 7a) can be formed in an n-type cladding layer 3 so as to surround the outer edge of the main-electrode-portion 6-0 with a predetermined width between them. In this arrangement, the width of a region extending between the inner edges of the first-conduction-type-side electrode (carrier-injecting-region 7a) via the center of the second-conduction-type-side electrode 6 (the center of the constant-width figure) can be held constant. This makes it possible to make uniform the injection of carriers into an active layer structure 4, and improve the in-plane uniformity of the emission intensity near the second-conduction-type-side electrode.

As described earlier, giving curve of constant width or constant-width figures to the shapes of the outer edge of the main-electrode-portion 6-0 and the inner edge of the carrier-injecting-region 7a helps improve the in-plane uniformity of the emission intensity in each individual light emitting portion. On the other hand, the first-extracting-portion 6-1 is formed to extract the main-electrode-portion 6-0 (carrier-injecting-region 6a) outside the first-conduction-type-side electrode 7 through the opening 7p of the first-conduction-type-side electrode 7. In an arrangement in which the light emitting device is mounted on a submount (heat sink block) by flip chip mounting, therefore, those leads of the submount which approach the main-electrode 6-0 need not intersect the first-conduction-type-side electrode 7. This allows a pair of leads (positive and negative leads) formed on the submount to approach the main-electrode 6-0 (second-conduction-type-side electrode 6) and first-conduction-type-side electrode 7 by two-dimensional connection instead of three-dimensional connection. This arrangement can increase the sectional area of the connection formed by a metal material (typically, metal solder) from the electrodes 6 and 7 to the leads. This makes it possible to raise the efficiency of heat radiation from the light emitting device to the submount, and facilitates increasing the output.

It is confirmed that when a width W of the curve of constant width or the constant-width figure portion of the main-electrode-portion 6-0 (carrier-injecting-region 6a) is 2,500 μm or less, it is possible to uniformly emit light from the entire surface of the region near the p-type-side electrode 6 of the active layer structure 4. To improve the in-plane uniformity of the emission intensity, it is necessary to relatively minimize the deviation (deformation) of the main-electrode-portion 6-0 or first-conduction-type-side electrode 7 (carrier-injecting-region 7a) from the strict curve of constant width or constant-width figure caused by the formation of the extracting portion 6-1. When this is taken into consideration, to reduce the deviation of the strictness of the constant-width figure by the extracting-portion 6-1, the width W of the main-electrode-portion 6-0 (carrier-injecting-region 6a) is preferably relatively equal to or larger than a certain value, and more preferably 400 μm or more. Accordingly, when the main-electrode portion 6-0 (carrier-injecting-region 6a) is formed to have a curve of constant width, the width W of this constant-width figure portion desirably satisfies $$400\ \mu m \leq W \leq 2500\ \mu m \tag{13}$$

More desirably, the width W of the constant-width figure portion satisfies $$700\ \mu m \leq W \leq 2000\ \mu m \tag{14}$$

The interval x between the outer edge of the main-electrode-portion 6-0 (carrier-injecting-region 6a) and the inner edge of the first-conduction-type-side electrode 7 (carrier-injecting-region 7a) is preferably determined to satisfy equation (15), more preferably determined to satisfy equation (16), and, typically, can be determined to satisfy equation (17).

$$3\ \mu m \leq x \leq 500\ \mu m \tag{15}$$

$$10\ \mu m \leq x \leq 300\ \mu m \tag{16}$$

$$30\ \mu m \leq x \leq 100\ \mu m \tag{17}$$

Figure 2:
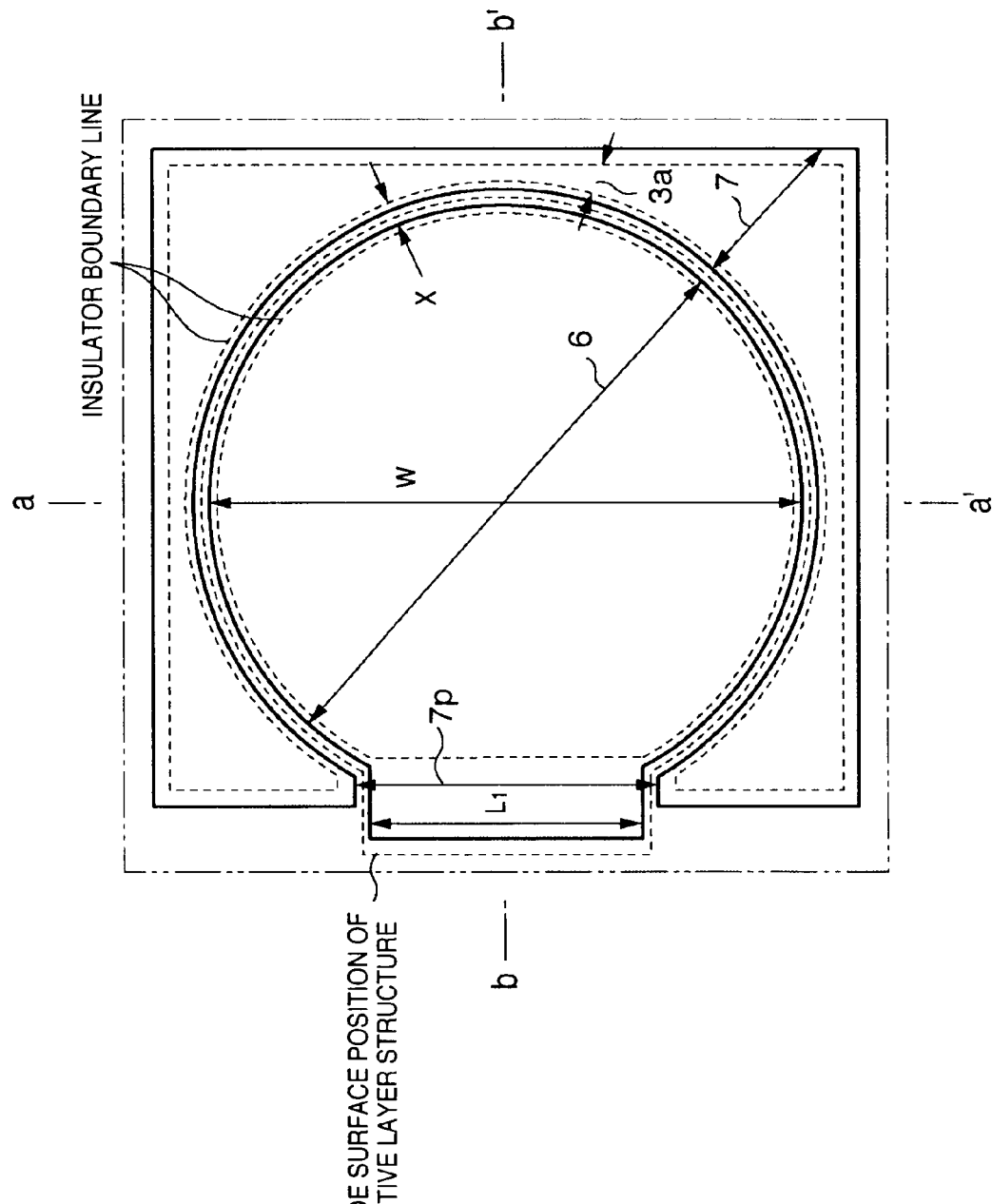
FIG. 2 is a plane view showing the structure of a compound semiconductor light emitting device of the second embodiment of the present invention.
Figure 3:
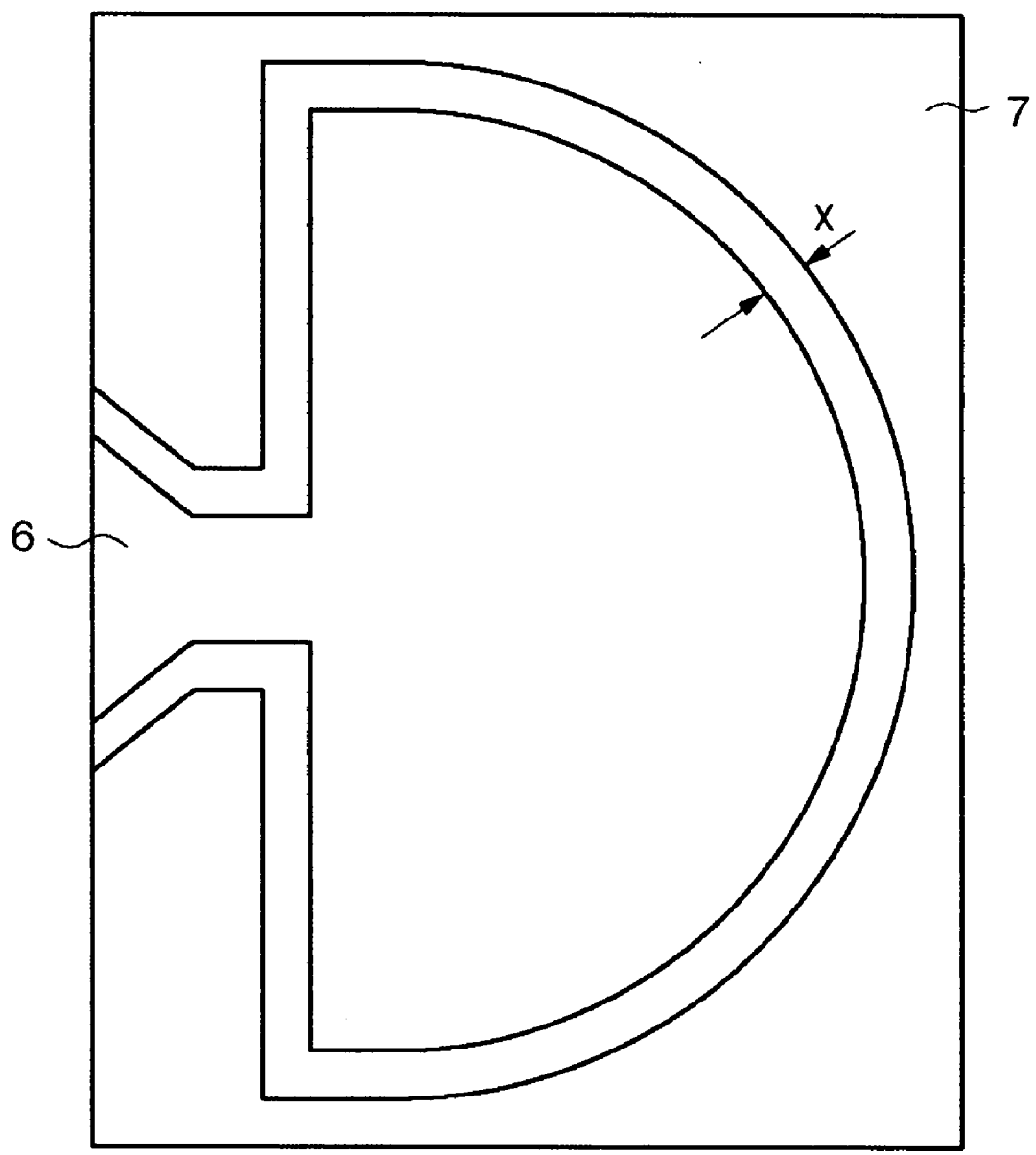
FIG. 3 is a plane view showing the structure of a compound semiconductor light emitting device of the third embodiment of the present invention.

From the viewpoint of the in-plane uniformity of the emission intensity, the constant-width figure portion forming the main-electrode-portion 6-0 (carrier-injecting-region 6a) is preferably a circle as exemplarily shown in FIG. 1, 2, or 3. This is so because carriers are readily evenly injected from the periphery to the center.

Figure 4:
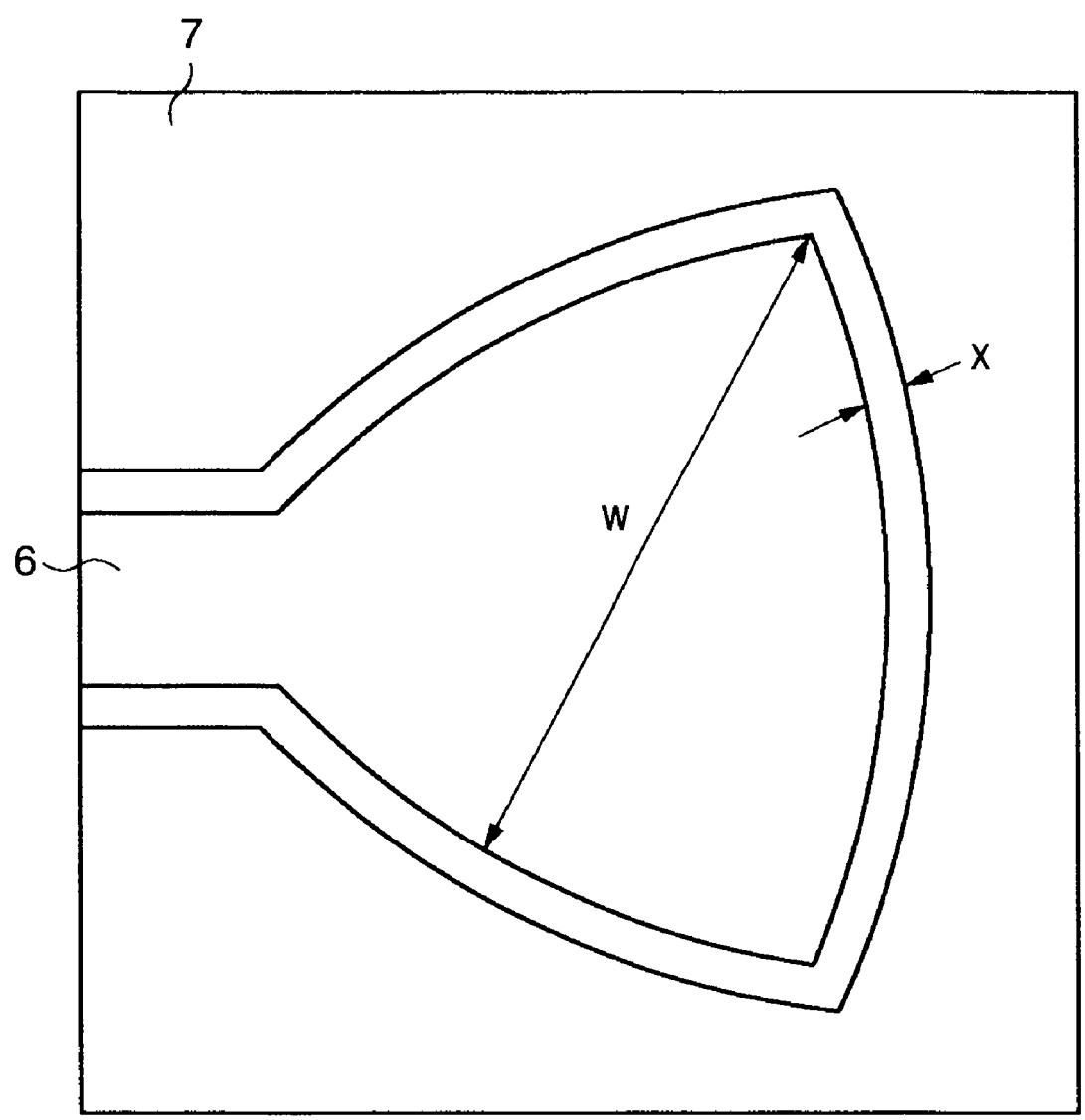
FIG. 4 is a plane view showing the structure of a compound semiconductor light emitting device of the fourth embodiment of the present invention.
Figure 5:
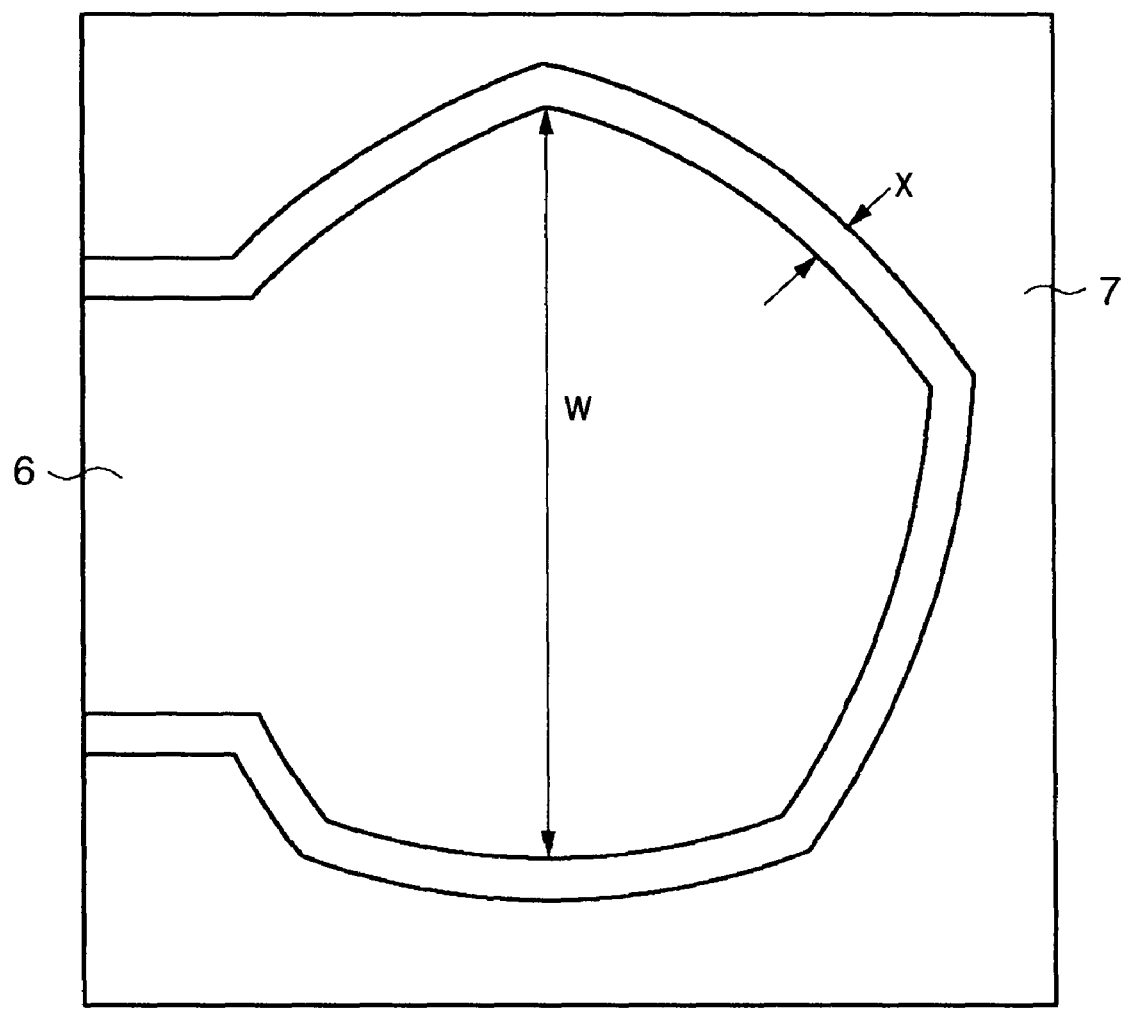
FIG. 5 is a plane view showing the structure of a compound semiconductor light emitting device of the fifth embodiment of the present invention.
Figure 6A:
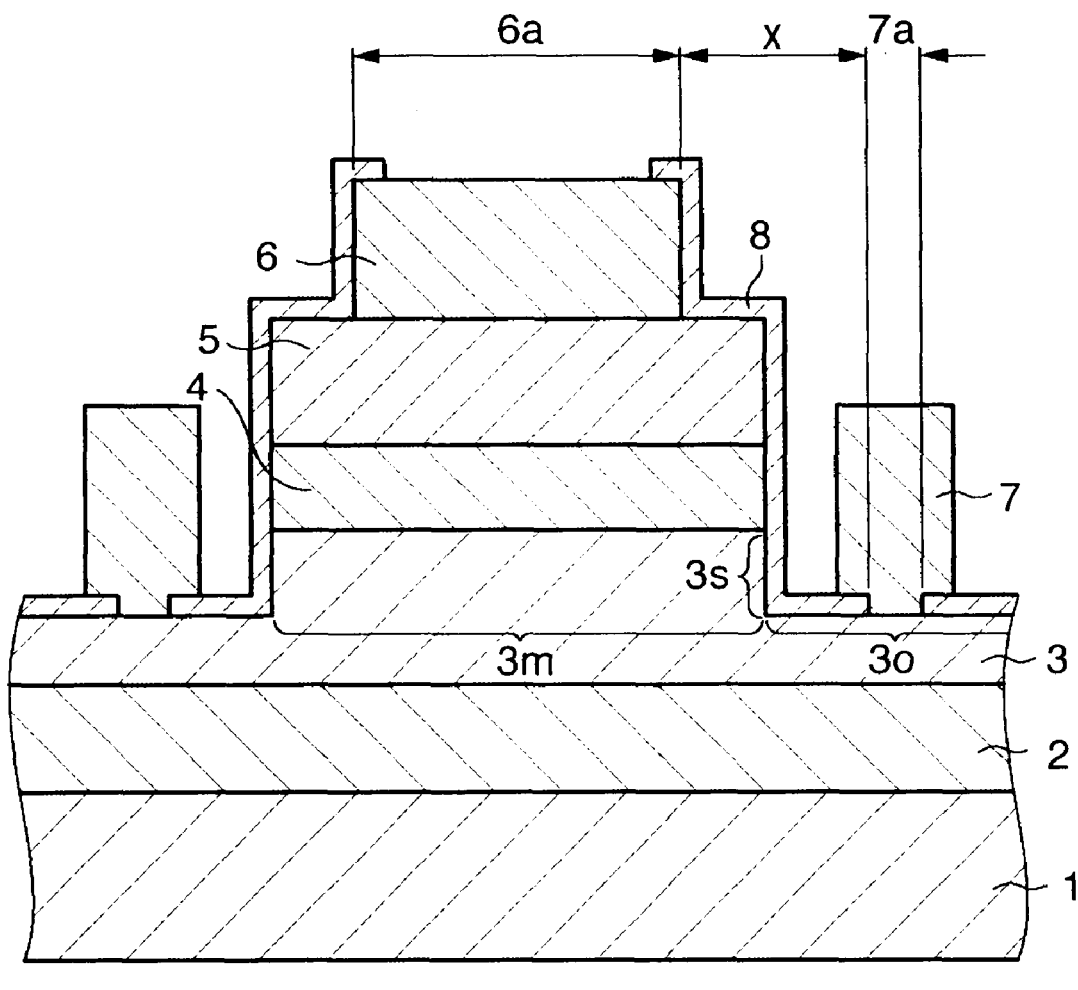
FIG. 6A is an exemplary sectional view taken along a line aa' in FIGS. 1 and 2.
Figure 6A:
Figure 6B:
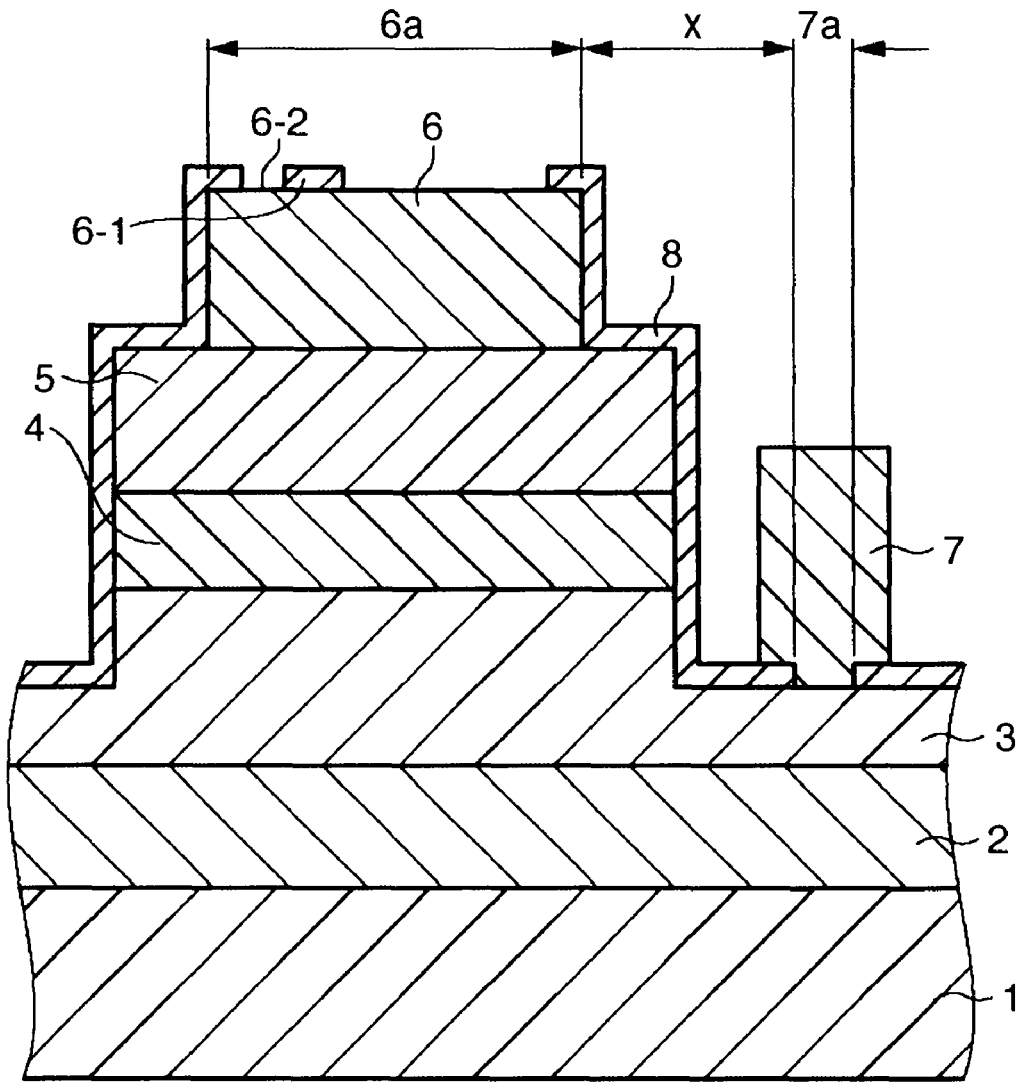
FIG. 6B is an exemplary sectional view taken along a line bb' in FIG. 1.
Figure 6C:
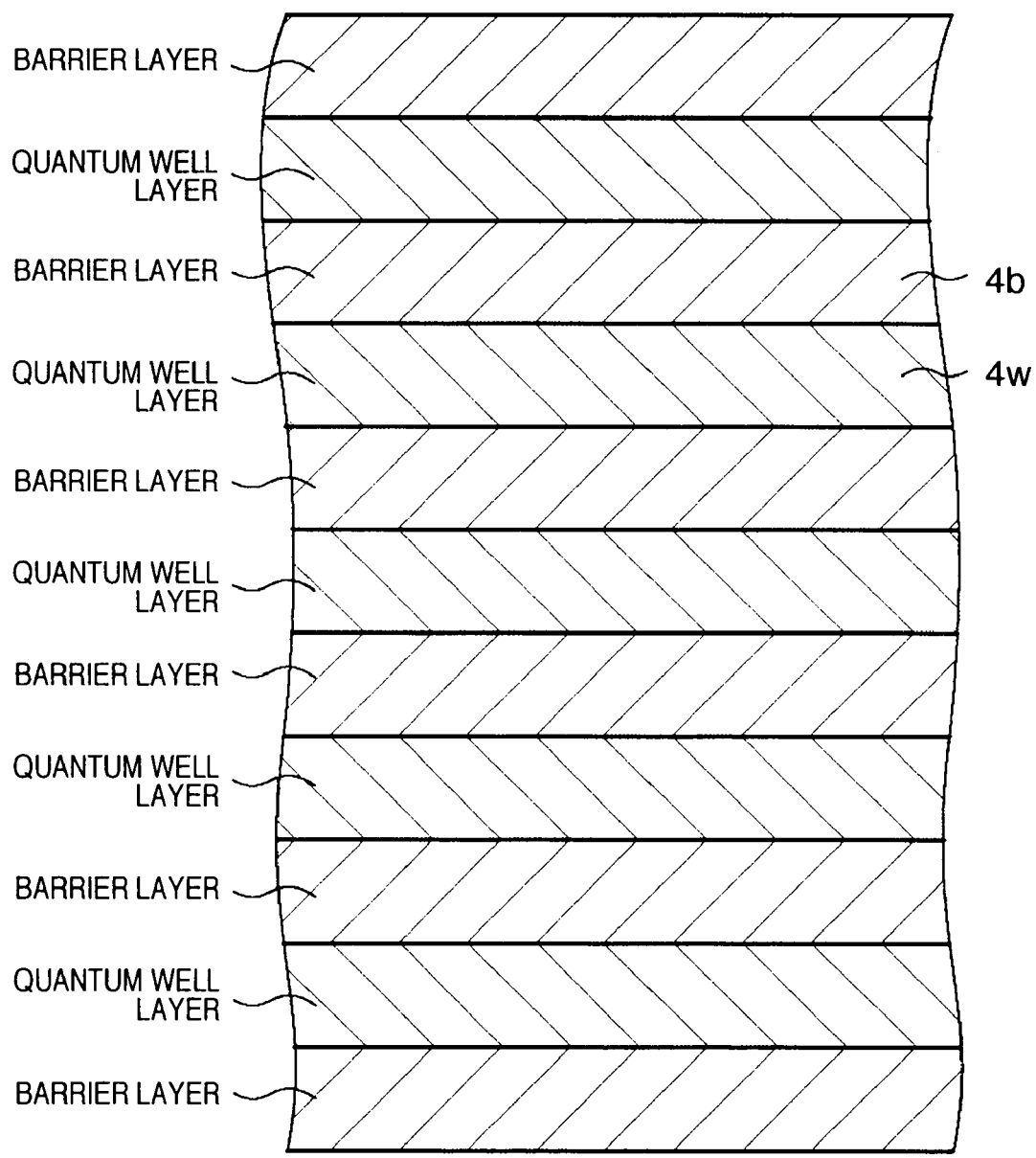
FIG. 6C is a view exemplarily showing an active layer structure suited to the embodiments shown in FIGS. 1 to 5.

The constant-width figure portion forming the main-electrode-portion 6-0 (carrier-injecting-region 6a) may also be a Reuleaux polygon as exemplarily shown in FIG. 4 or 5. Note that although FIGS. 4 and 5 illustrate the electrode shapes, the carrier-injecting-region conforms to these. The width of the region extending between the inner edges of the first-conduction-type-side electrode 7 (carrier-injecting-region 7a) via the center of the second-conduction-type-side electrode 6 (the center of the constant-width figure or the curve of constant width) can be held constant in this case as well. Accordingly, carriers are readily evenly injected from the periphery to the center of the active layer structure 4. This favorably contributes to uniform light emission from the light emitting portion.

The use of a Reuleaux polygon as the curve of constant width or the constant-width figure is more advantageous than the use of a circle in densely arranging a plurality of p-type-side electrodes including constant-width figure portions. That is, Reuleaux polygons can be arranged more densely than circles. This means the increase in area of the light emitting portions in the overall area of the light emitting device. Of Reuleaux polygons, a Reuleaux triangle as exemplarily shown in FIG. 4 is particularly advantageous in integration. When the light emitting device is formed by arranging a plurality of light emitting portions by using the main-electrode-portion 6-0 (carrier-injecting-region 6a) and first-conduction-type-side electrode 7 (carrier-injecting-region 7a) each having the shape of a Reuleaux triangle, it is possible to increase the in-plane uniformity of the emission intensity in each individual light emitting portion. In addition, the high-density arrangement of the light emitting portions can increase the in-plane uniformity of the emission intensity even in the whole of a relatively large light emitting device.

The shape explained as "a curve of constant width or a constant-width figure" in this specification is not limited to a strict curve of constant width or a strict constant-width figure, and can include a shape whose width has a deviation (allowance) of about ±10% from a reference value. Also, the existence of the extracting-portion 6-1 naturally affects or deforms a portion of the constant-width figure of the main-electrode-portion 6-0. Therefore, "a curve of constant width or a constant-width figure" mentioned in this specification can include a shape obtained by partially cutting a strict constant-width figure or a constant-width figure having the allowance as described above.

A width $L_1$ of the first-extracting-portion 6-1 preferably does not exceed the width W of the curve of constant width or the constant-width figure. If the width $L_1$ of the extracting-portion 6-1 is too small, the electrode resistance increases, so $L_1$ is favorably 5% or more of the width W of the curve of constant width or the constant-width figure. Accordingly, the second-conduction-type-side electrode 6 for injecting carriers into the p-type cladding layer 5 preferably satisfies equation (18), and more preferably satisfies equation (19).

$$W/20 \leq L_1 \leq W \tag{18}$$

$$W/5 \leq L_1 \leq W/2 \tag{19}$$

The constant-width portion shown in FIG. 3 is a circle (semicircle). FIG. 3 exemplarily shows a favorable case of the limit of destruction of the constant-width figure by the connection with the extracting-portion. Note that $L_1$ is an amount concerning the injection of carriers, and an amount to be defined by the width of the carrier-injecting-region.

Assuming $L_2$ to be the outer edge length of that portion of the carrier-injecting-portion 6a of the second-conduction-type-side electrode 6, which is surrounded by the carrier-injecting-region 7a on the outside, and assuming $L_3$ to be the outer edge length of that portion of the carrier-injecting-portion 6a of the second-conduction-type-side electrode 6, which is formed by the constant-width figure, equation (20) below is preferably met in order to prevent the existence of the extracting-portion 6-1 from excessively deforming the main-electrode-portion 6-0. Note that $L_2$ and $L_3$ are also amounts pertaining to the injection of carriers, and amounts to be defined by the lengths in the carrier-injecting-region.

$$L_2/2 \leq L_3 \leq L_2 \qquad (20)$$

The extracting-portion can have any arbitrary shape. However, the extracting-portion desirably has a rectangular portion as shown in FIG. 2, 4, or 5 in order to improve the junction with a submount or device supporting substrate, or to increase the degrees of integration of the electrode shapes and carrier-injecting-regions. As exemplarily shown in FIG. 3, the extracting-portion may also have a portion that narrows toward the constant-width figure portion side of the first-conduction-type-side electrode 7 (carrier-injecting-region 7a). This makes it possible to prevent the excess increase in connecting resistance and reduce the non-uniformity of carrier injection by the extracting portion at the same time. The wide portion is also advantageous for the junction with another electrode, a submount, or a device supporting substrate.

In a plan view in which the device shape is viewed in a direction opposite to the main light extracting direction, the side surfaces of the active layer structure 4 are preferably positioned between the first-conduction-type-side electrode 7 (carrier-injecting-region 7a) and second-conduction-type-side electrode 6 (carrier-injecting-region 6a). In a plan view, the side surfaces of the active layer structure 4 are particularly favorably positioned between the entire p-type-side carrier-injecting-region 6a and entire n-type-side carrier-injecting-region 7a in the curve of constant width or the constant-width figure portion. In this case, the carrier injection efficiency increases, and this increases the emission efficiency.

Light emitting devices of preferred embodiments of the present invention in which a plurality of electrodes each including a constant-width figure potion are arranged will be explained below with reference to FIGS. 7A, 7B, 8, 9A, and 9B. FIGS. 7A, 7B, 8, 9A, and 9B illustrate examples in which the shape of the electrode matches that of the carrier-injecting-region. However, the carrier-injecting-region may also be defined by an insulator as described previously. The explanation will be made by assuming that the first-conduction-type is an n-type and the second-conduction-type is a p-type.

A second-conduction-type-side electrode 6 for injecting carriers into a p-type cladding layer includes a main-electrode-portion (part of curve of constant width or constant-width figure portion) and extracting-portion. The main-electrode-portion contributes to uniform light emission in each individual light emitting portion. The extracting-portion connects the main-electrode-portions of a plurality of light emitting portions.

Figure 7A:
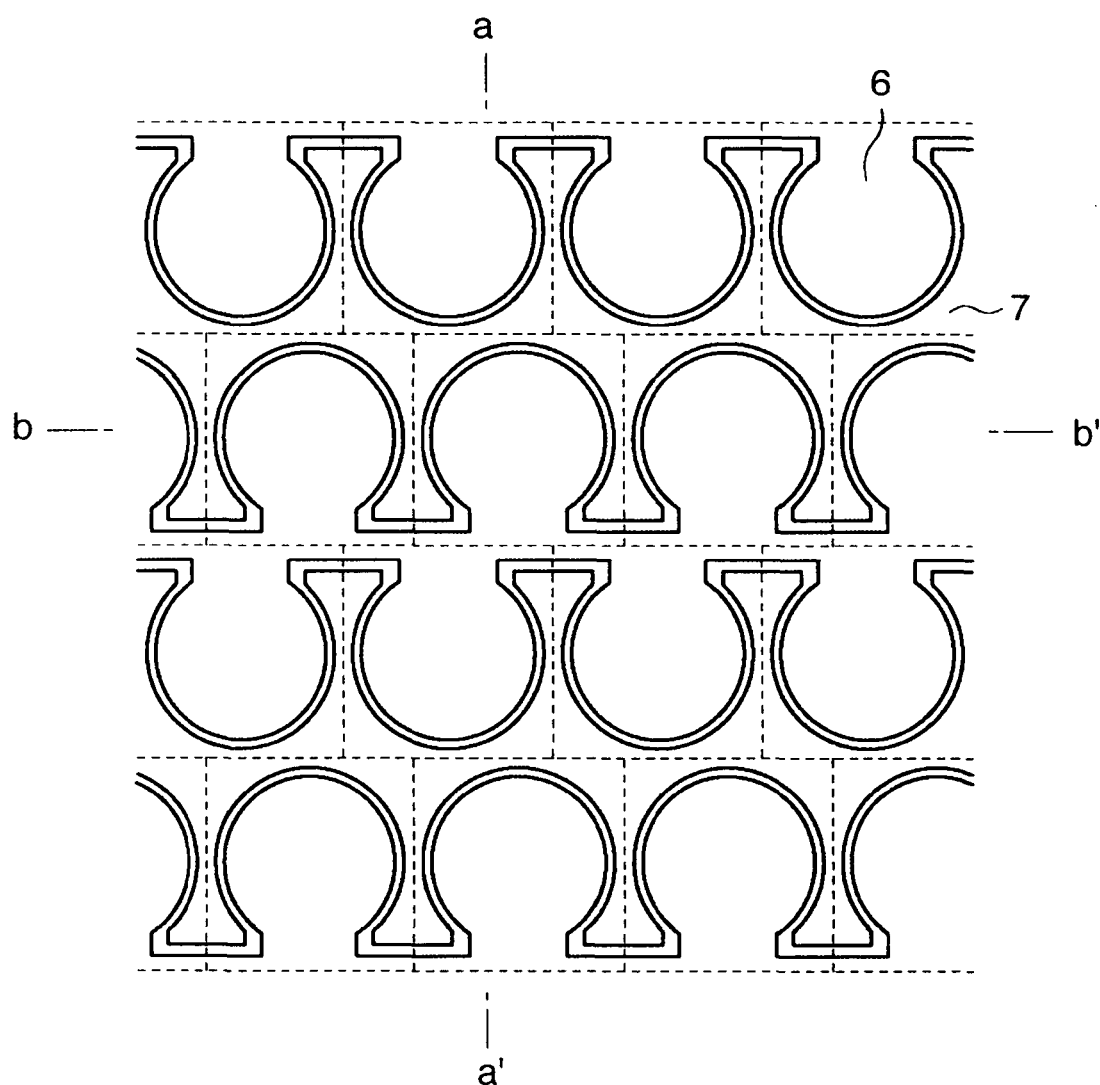
FIG. 7A is a view showing the first example of a light emitting device having a plurality of main-electrode portions of a preferred embodiment of the present invention.

In the example shown in FIG. 7A, the electrode 6 has a circular main-electrode-portion. In the example shown in FIG. 7B, the electrode 6 has a main-electrode-portion having the shape of a Reuleaux triangle. The electrodes 6 having the shape of a Reuleaux triangle are superior in respect of integration and can be arranged at a high-density.

Figure 8:
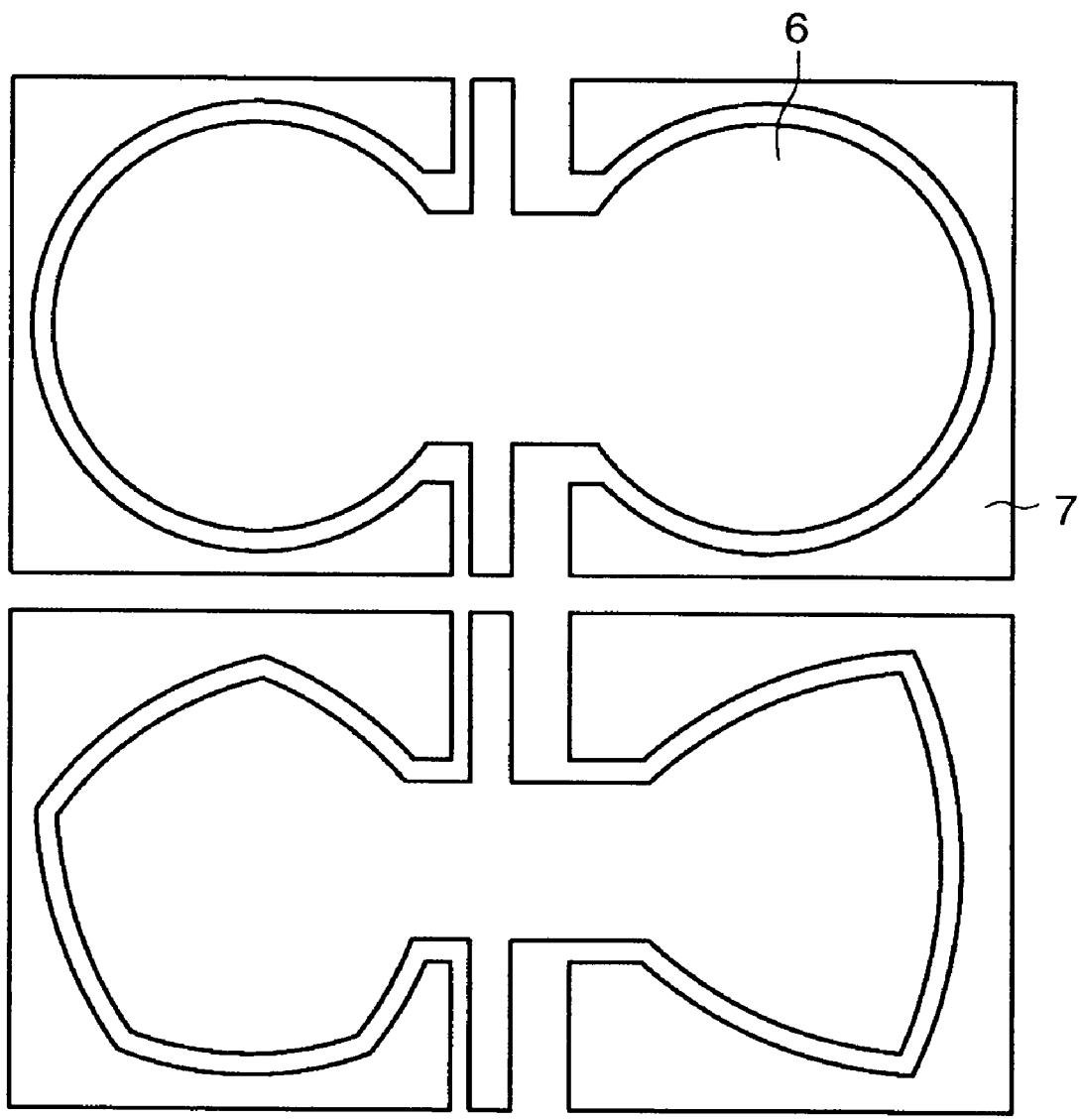
FIG. 8 is a view showing the third example of the light emitting device having a plurality of main-electrode portions of a preferred embodiment of the present invention.

FIG. 8 is a view showing an example of a light emitting device including electrodes having the shapes of a plurality of types of curve of constant width or constant-width figures. A light emitting device obtained by integrating a plurality of light emitting devices may include a plurality of types of shapes as the shapes of the electrodes of the light emitting devices. Note that in this case, the shape of the extracting-portion preferably compensates for the difference between the resistances of electrodes having different shapes.

Figure 9B:
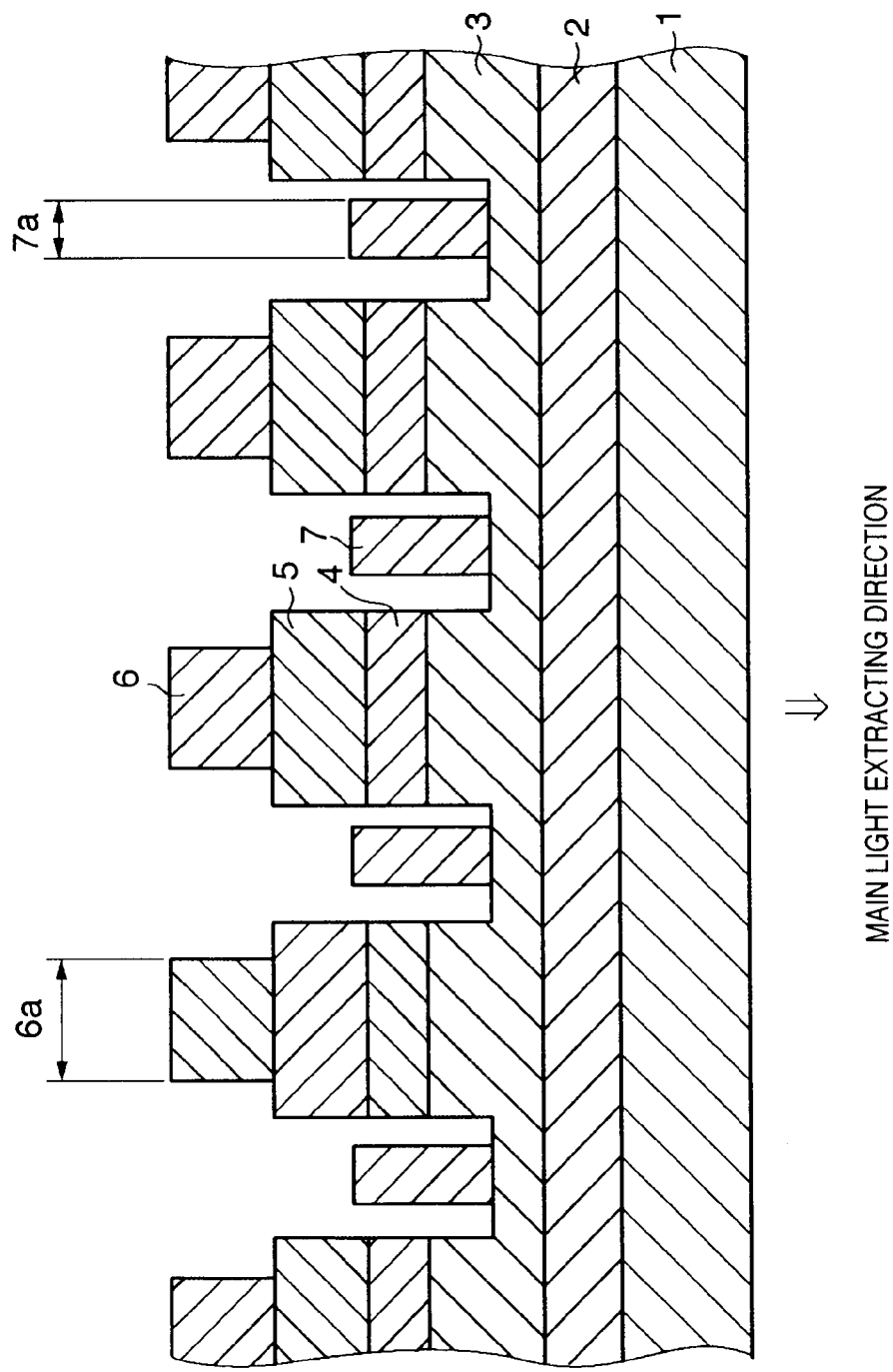
FIG. 9B is an exemplary sectional view taken along a line bb' in FIG. 7A.

FIGS. 9A and 9B are exemplary sectional views taken along lines aa' and bb', respectively, in FIG. 7.

Note that the explanation has been made by assuming that the first-conduction-type is an n-type and the second-conduction-type is a p-type, but the conduction types may also be switched.

After any of the structures shown in FIGS. 1 to 9B is formed as described above, scribing is performed for every predetermined number (one or a plurality of) light emitting portions, if no substrate removal is scheduled. In this case, diamond scribing, laser scribing, or the like can be performed.

When scribing (scratching) is complete, the substrate is divided in a breaking step. Each divided substrate can be mounted on a submount or device support substrate by using a soldering material or the like.

The submount or device-supporting-plate preferably has a metal surface, and has both functions of injecting carriers into the light emitting device mounted by flip chip mounting and radiating heat from it. The light emitting device can be attached on the metal surface of the submount by using any of various soldering materials or paste materials. However, a compound semiconductor light emitting device is particularly preferably mounted by using metal solder. Metal solder is superior in heat radiation properties, and hence contributes to the high-output operation and high-efficiency light emission of the light emitting device. Also, the sidewalls of other epitaxial layers are desirably protected by an insulator except for undoped portions. In this case, it is possible to prevent shortcircuits in the epitaxial layers, such as shortcircuits on the active layer structure sidewalls and shortcircuits between light emitting units, even if, for example, the solder oozes out.

Note that in the light emitting device of the present invention as described above, the second-conduction-type-side electrode for injecting carriers into the second-conduction-type cladding layer and the first-conduction-type-side electrode for injecting carriers into the first-conduction-type cladding layer preferably do not spatially overlap each other, and the first-conduction-type-side electrode preferably has a sufficient area larger than that of the first-carrier-injecting-region. This makes it possible to prevent unexpected shortcircuits and ensure good heat radiation properties at the same time. Also, the sidewalls of other epitaxial layers are desirably protected by an insulator. In this case, it is possible to prevent shortcircuits in the epitaxial layers, such as shortcircuits on the sidewalls of the active layer structure and shortcircuits between light emitting units, even if, for example, the solder oozes out. The solder material to be used to join the submount and element is preferably metal solder such as In, InAg, PbSn, SnAg, AuSn, AuGe, and AuSi. These solder materials can be appropriately selected in accordance with the use temperature environment of the element and the like.

On the other hand, if substrate removal is scheduled, the whole or part of the substrate of any of the structures shown in FIGS. 1 to 9B is usually attached to a device-supporting-plate. This is so because if the substrate is removed, the total thickness of the epitaxial layers is at most about 15 µm, so the mechanical strength is insufficient.

The device-supporting-plate is essentially capable of functioning as a support of the epitaxial layers after substrate removal. In addition, the device-supporting-plate favorably has functions of supplying an electric current and radiating heat after the device is completed. From this point of view, the base material of the device-supporting-plate is preferably one of AlN, SiC, diamond, BN, and CuW. These materials are favorable because they are superior in heat radiation properties and can efficiently reduce the problem of heat generation that is unavoidable in a high-output light emitting device. $Al_2O_3$, Si, glass, and the like are also desirable because they are inexpensive and widely usable as a device-supporting-plate. Furthermore, when partially decomposing the epitaxial layers into Ga as a metal and nitrogen by laser irradiation for substrate removal (to be described later), wet etching is preferably performed to remove Ga as a metal. In this case, the device-supporting-plate is favorably made of a material that is not etched.

The device-supporting-plate preferably has an electrode interconnection for carrier injection on the base material in order to have both the functions of injecting carriers and radiating heat after the device is completed, and preferably has an adhesive layer for appropriately attaching the device and support in a portion of the electrode interconnection on which the device is to be mounted. Although the adhesive layer can be paste containing Ag, a metal bump, or the like, the layer is very preferably made of metal solder from the viewpoint of the heat radiation properties. The metal solder can achieve flip chip mounting much superior in heat radiation properties to the paste material containing Ag, the metal bump, and the like. The metal solder preferably contains a material Selected from In, InAg, InSn, SnAg, PbSn, AuSn, AuGe, and AuSi, and is particularly favorably solders high-melting point such as AuSn, AuSi, or AuGe. This is so because when a large electric current is supplied to operate the light emitting device at an ultrahigh output, the temperature near the device rises to about 200° C. Accordingly, the metal solder having a melting point higher than the device temperature during driving as the melting point of a solder material is more favorable. In some cases, it is also desirable to use a bump in order to cancel out a step of the device during flip chip mounting, and form a junction while burying the bump with a metal solder material.

After the device is mounted on the device-supporting-plate, the substrate can be removed. In this case, the substrate can be removed by any method such as polishing, etching, or laser debonding.

When polishing a sapphire substrate, the substrate can be removed by using a polishing material such as diamond. The substrate can also be removed by dry etching. Furthermore, when sapphire is the substrate and the epitaxially grown portion is made of an InAlGaN-based material, it is possible to perform laser debonding that removes the sapphire substrate by irradiating, from the substrate side, a 248-nm excimer laser transmitted through the sapphire substrate and absorbed by GaN used in a buffer layer or the like, thereby decomposing GaN as a part of the buffer layer into Ga as a metal and nitrogen.

When ZnO is the substrate, the substrate can also be wet-etched by using an etchant such as HCl.

EXAMPLES

The features of the present invention will be explained in more detail below by way of its examples. The materials, amounts of use, ratios, processing contents, procedures, and the like exemplified in the following examples can be appropriately changed as long as they do not depart from the spirit and scope of the invention. Accordingly, the scope of the present invention should not be limitedly interpreted by means of the following practical examples. Also, the drawings referred to in the following examples have portions in which dimensions are intentionally changed to facilitate understanding the structures. However, the actual dimensions are as described in the following explanation.

Example 1

Figure 10:
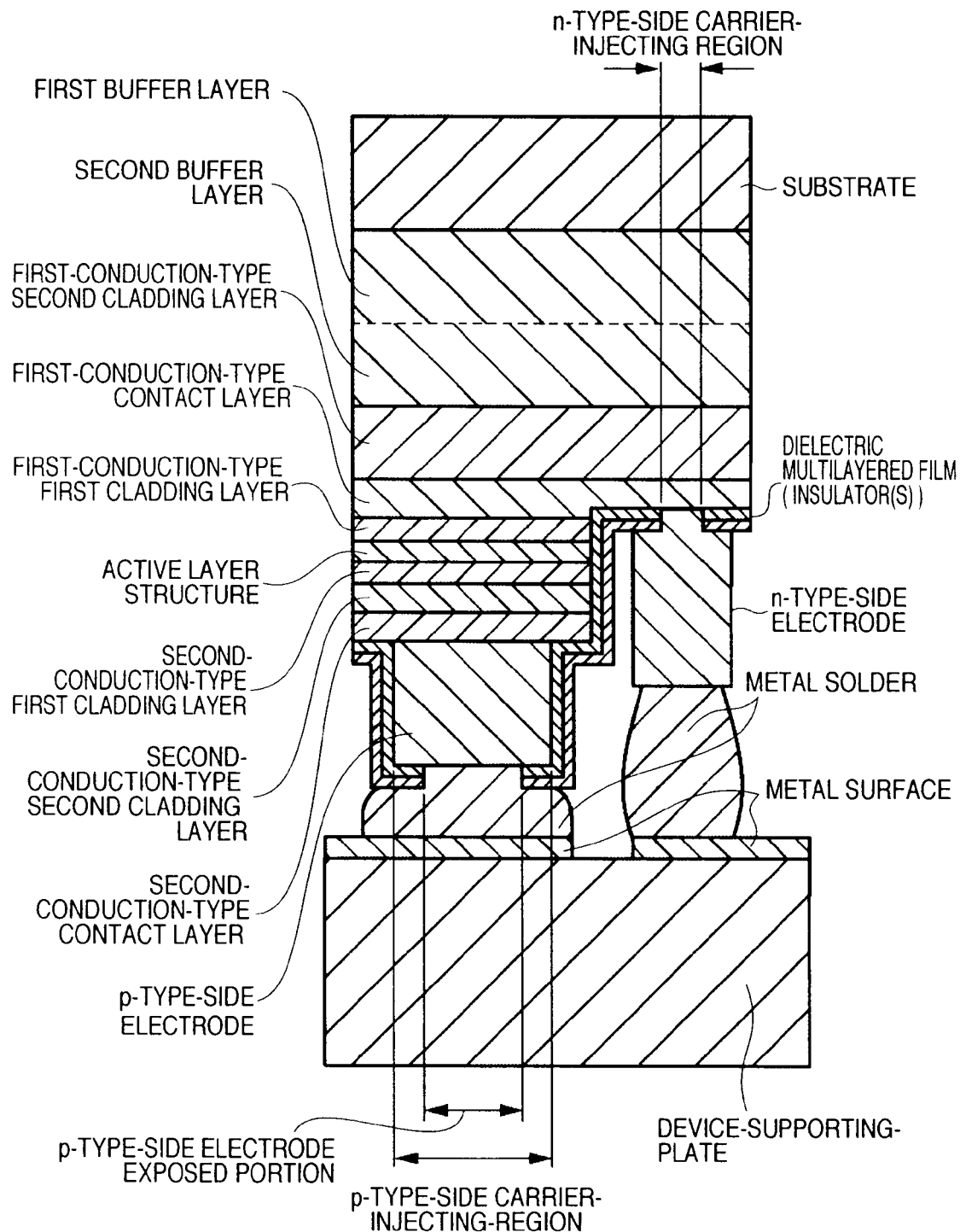
FIG. 10 is a view showing the first example of flip chip mounting of a light emitting device of a preferred embodiment of the present invention.

The semiconductor light emitting device exemplarily shown in FIG. 1 was fabricated following the procedure explained below so as to be mounted by flip chip mounting as shown in FIG. 10. FIG. 10 corresponds to the exemplary section along the line bb'.

On a 430-μm thick c+ plane sapphire substrate, 10-nm thick undoped GaN grown at a low temperature was grown as a first buffer layer by MOCVD, and 2-μm thick undoped GaN was grown at 1,040° C. as a second buffer layer after that. In addition, a 2-μm thick Si-doped (Si concentration=$1\times10^{18}$ ($cm^{-3}$)) GaN layer was formed as a first-conduction-type second cladding layer, a 0.5-μm thick Si-doped (Si concentration=$2\times10^{18}$ ($cm^{-3}$)) GaN layer was formed as a first-conduction-type contact layer, and a 0.1-μm thick Si-doped (Si concentration=$1.5\times10^{18}$ ($cm^{-3}$)) $Al_{0.15}Ga_{0.85}N$ layer was formed as a first-conduction-type first cladding layer. As an active layer structure, a 13-nm thick undoped GaN layer was grown at 850° C. as a barrier layer, a 2-nm thick undoped $In_{0.1}Ga_{0.9}N$ layer was formed at 720° C. as a quantum well layer, a 13-nm thick undoped GaN layer was formed at 850° C. as a barrier layer, a 2-nm thick undoped $In_{0.1}Ga_{0.9}N$ layer was formed at 720° C. as a quantum well layer, a 13-nm thick undoped GaN layer was formed at 850° C. as a barrier layer, a 2-nm thick undoped $In_{0.1}Ga_{0.9}N$ layer was formed at 720° C. as a quantum well layer, a 13-nm thick undoped GaN layer was formed at 850° C. as a barrier layer, a 2-nm thick undoped $In_{0.1}Ga_{0.9}N$ layer was formed at 720° C. as a quantum well layer, a 13-nm thick undoped GaN layer was formed at 850° C. as a barrier layer, a 2-nm thick undoped $In_{0.1}Ga_{0.9}N$ layer was formed at 720° C. as a quantum well layer, and a 13-nm thick undoped GaN layer was formed at 850° C. as a barrier layer. The growth temperature was raised to 1,025° C., and 0.1-μm thick Mg-doped (Mg concentration=$5\times10^{19}$ ($cm^{-3}$)) $Al_{0.15}Ga_{0.85}N$ was formed as a second-conduction-type first cladding layer. Successively, 0.05-μm thick Mg-doped (Mg concentration=$5\times10^{19}$ ($cm^{-3}$)) GaN was formed as a second-conduction-type second cladding layer. Finally 0.02-μm thick Mg-doped (Mg concentration=$1\times10^{20}$ ($cm^{-3}$)) GaN was formed as a second-conduction-type contact layer.

After that, the temperature was gradually lowered in an MOCVD growing furnace, and the wafer was unloaded from the furnace, thereby finishing epitaxial growth.

To form a p-type-side electrode on the wafer having undergone epitaxial growth, photolithography was used to make a preparation for patterning a p-type-side electrode by lift-off, and form a resist pattern. 200-Å thick Ni and 5,000-Å thick Au were formed by vacuum evaporation such that a curve of constant width or a constant-width figure for forming a previously designed p-type-side electrode was a circle having a diameter of 800 μm, that the length of a portion between a rectangular first-extracting-portion forming the p-type-side electrode and a portion close to the constant-width figure was 200 μm, and that the width of the other side of the first-extracting-portion was 75 μm, and that the length in the longitudinal direction of a rectangular second-extracting-portion forming the p-type-side electrode and spaced apart from the constant-width figure was 1,150 μm, and that the width in the lateral direction was 75 μm. Unnecessary portions were removed in acetone by lift-off. After that, the p-type-side electrode was completed by annealing. In this case, no damage was inflicted on a p-type-side carrier-injecting-region because the p-type-side electrode was formed without any plasma process or the like.

Subsequently, an etching mask was formed in order to perform a first etching step. That is, p-CVD was used to form 0.4-μm thick $SiN_x$ on the entire wafer surface at a substrate temperature of 400° C. Since Au covered the p-type-side electrode surface, the surface was not damaged at all by the $SiN_x$ film formation process using p-CVD. The $SiN_x$ mask was patterned by performing photolithography again, thereby forming an $SiN_x$ etching mask. In this step, unnecessary portions of the $SiN_x$ film were etched away by RIE using $SF_6$ plasma, the mask was left behind on portions where the epitaxial layers were not to be etched in the first etching step (to be described later), and the $SiN_x$ film was removed from portions corresponding to those portions of the epitaxial layers which were scheduled to be etched away.

As the first etching step, ICP plasma etching using $Cl_2$ gas was performed on the p-GaN contact layer, the p-GaN second cladding layer, the p-AlGaN first cladding layer, the active layer structure including the InGaN quantum well layers and GaN barrier layers, and the n-AlGaN first cladding layer, and to the middle of the n-GaN contact layer, thereby exposing the n-type contact layer as an n-type carrier-injecting-portion.

After ICP plasma etching was complete, the $SiN_x$ mask was entirely removed by using buffered hydrofluoric acid. Since Au was exposed to the p-type-side electrode surface, the surface was not damaged at all by the $SiN_x$ film formation process using p-CVD in this case as well.

Then, a dielectric multilayered film made of $SiN_x$ and $SiO_x$ was formed as an insulator on the entire wafer surface by p-CVD. That is, the $SiN_x$ and $SiO_x$ layers were formed one by one so as to have a thickness by which the optical wavelength was ¼ the emission wavelength of the device, thereby obtaining a relatively high-reflectivity to the emission wavelength.

Subsequently, a resist mask was formed by photolithography in order to simultaneously form a p-type-side electrode exposed portion on the p-type-side electrode made of Ni—Au, and an n-type-side carrier-injecting-region on the n-type-side contact layer.

The dielectric multilayered film (insulator) on which no resist mask was formed was removed by using an RIE plasma of $SF_6$ gas such that the periphery of the curve of constant width or the constant-width portion of the p-type-side electrode was covered by 150 μm with the insulator made of $SiN_x$ and $SiO_x$, the first-extracting-portion was entirely covered with the insulator, and the periphery of the second extracting portion was covered by 15 μm with the insulator made of $SiN_x$ and $SiO_x$.

After that, the resist mask used was removed by acetone, and ashed away by RIE using oxygen plasma. Since Au was exposed to the surface of the p-type-side electrode, the surface was not damaged at all by the $SiN_x$ film formation process using p-CVD in this case as well.

To form an n-type-side electrode, photolithography was used to prepare for patterning of an n-type-side electrode by lift-off, and form a resist pattern. In this step, in a portion where an n-type-side electrode surrounded the circular constant-width figure of the p-type-side electrode, the distance X shown in FIG. 1, that is, the shortest distance from the portion where the p-type-side electrode was in contact with the p-type-side contact layer to the portion where an n-type-side electrode was in contact with the n-type-side contact layer was set at 75 μm. As an n-type-side electrode, 200-Å thick Ti and 3,000-Å thick Al were formed on the entire wafer surface by vacuum evaporation, and unnecessary portions were removed in acetone by lift-off. After that, the n-type-side electrode was completed by annealing. The n-type-side electrode was formed such that its periphery was in contact with the insulator by about 20 μm in order to make the area of the n-type-side electrode larger than that of the n-type-side carrier-injecting region, and that the n-type-side electrode did not overlap the p-type-side electrode. This facilitated flip chip bonding using metal solder, and improved the heat radiation properties and the like. An Al electrode is readily modified by, for example, a plasma process, and etched by, for example, hydrofluoric acid. However, the n-type-side electrode was not damaged at all because it was formed at the end of the device formation process.

Subsequently, to divide discrete light emitting devices formed on the wafer, a diamond scriber was used to form scribe-lines from the substrate side so as to obtain a square device of 1,200 mm width. In addition, breaking was performed along these scribe lines, thereby completing each compound semiconductor light emitting device. The device was then mounted on a device-supporting-plate by using AuSn solder, thereby completing the light emitting device. When carriers were injected into this device, light emitted from the p-type-side electrode in the main light extracting direction was uniform although the size of the p-type-side electrode was large.

Example 2

Figure 7B:
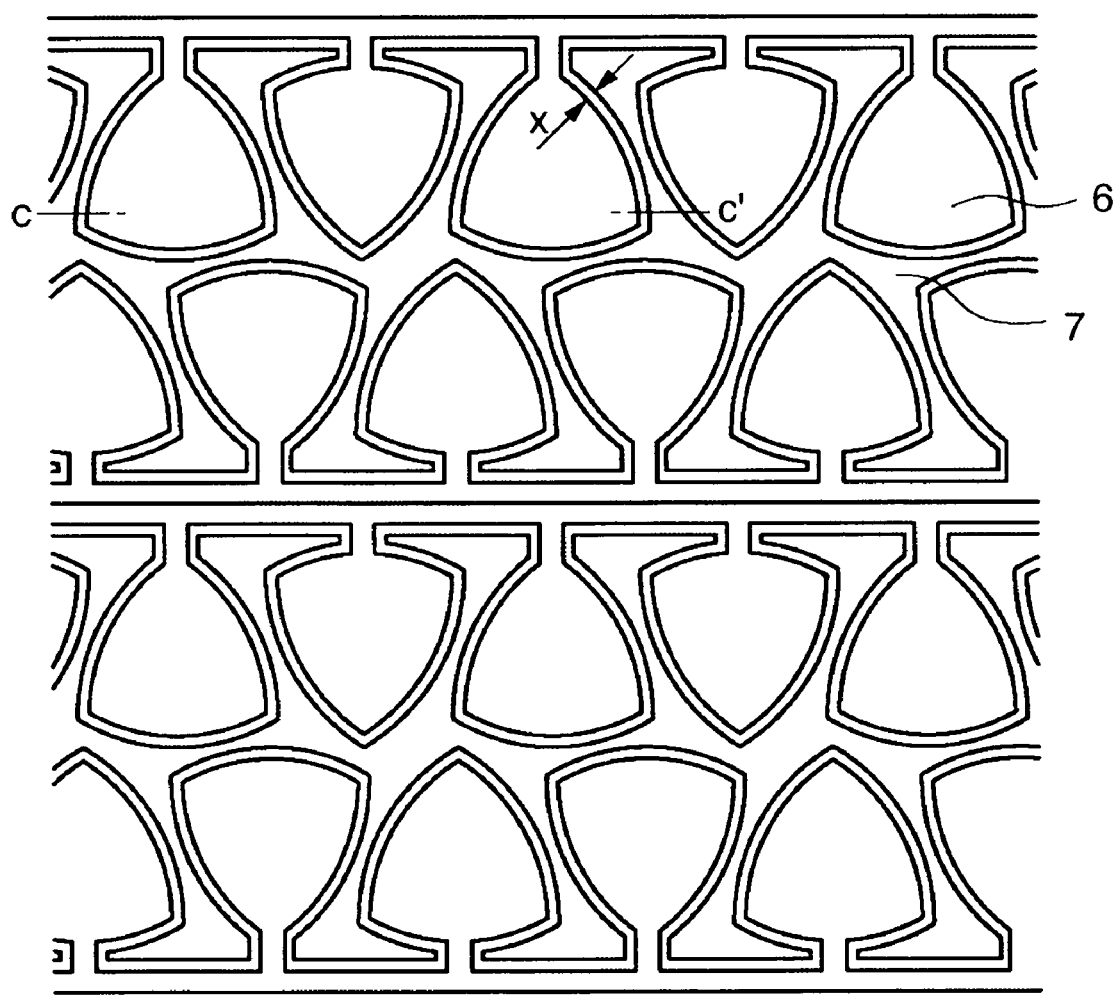
FIG. 7B is a view showing the second example of the light emitting device having a plurality of main-electrode portions of a preferred embodiment of the present invention.
Figure 11:
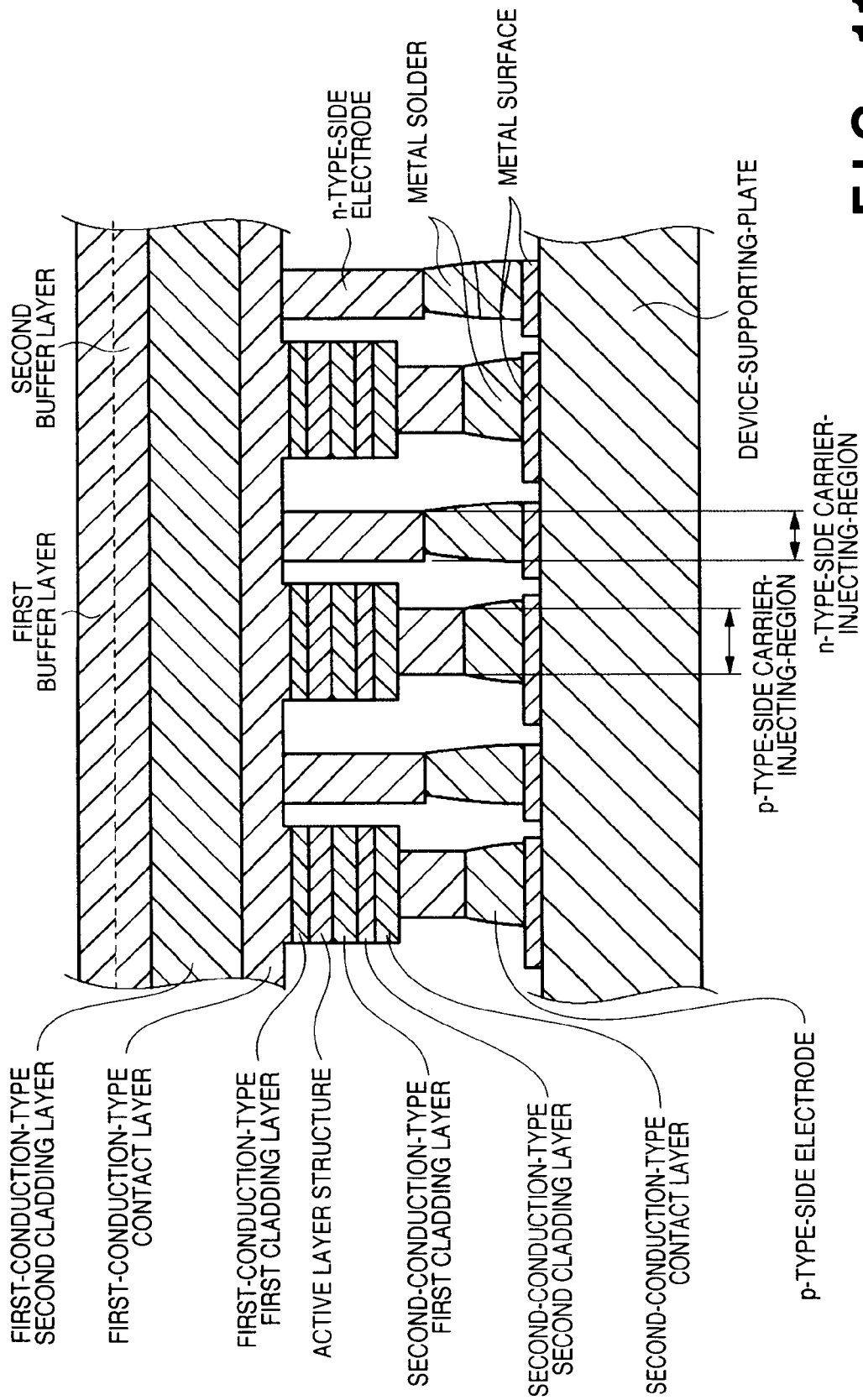
FIG. 11 is a view showing the second example of flip chip mounting of a light emitting device of a preferred embodiment of the present invention.

A device having the electrode shape shown in FIG. 7B was fabricated following the procedure explained below so as to be mounted by flip chip mounting while a substrate was removed as shown in FIG. 11. FIG. 11 corresponds to cc' in FIG. 7B.

On a 430-μm thick c+plane sapphire substrate, 20-nm thick undoped GaN grown at a low temperature was grown as a first buffer layer 1 by MOCVD, and 1-μm thick undoped GaN layer was formed at 1,040° C. as a second buffer layer 2 after that. Successively, a 2-μm thick Si-doped (Si concentration=$1 \times 10^{18}$ ($cm^{-3}$)) GaN layer was grown as a first-conduction-type second cladding layer, a 0.5-–m thick Si-doped (Si concentration=$2 \times 10^{18}$ ($cm^{-3}$)) GaN layer was formed as a first-conduction-type contact layer, and a 0.1-μm thick Si-doped (Si concentration=$1.5 \times 10^{18}$ ($cm^{-3}$)) $Al_{0.15}Ga_{0.85}N$ layer was formed as a first-conduction-type first cladding layer. In addition, as an active layer structure, a 13-nm thick undoped GaN layer was formed at 850° C. as a barrier layer, a 2-nm thick undoped $In_{0.13}Ga_{0.87}N$ layer was formed at 715° C. as a quantum well layer, a 13-nm thick undoped GaN layer was formed at 850° C. as a barrier layer, a 2-nm thick undoped $In_{0.13}Ga_{0.87}N$ layer was formed at 715° C. as a quantum well layer, a 13-nm thick undoped GaN layer was formed at 850° C. as a barrier layer, a 2-nm thick undoped $In_{0.13}Ga_{0.87}N$ layer was formed at 715° C. as a quantum well layer, and a 13-nm thick undoped GaN layer was formed at 850° C. as a barrier layer.

The growth temperature was raised to 1,025° C., and 0.1-μm thick Mg-doped (Mg concentration=$5 \times 10^{19}$ ($cm^{-3}$)) $Al_{0.15}Ga_{0.85}N$ was formed as a second-conduction-type first cladding layer. Successively, 0.05-μm thick Mg-doped (Mg concentration=$5 \times 10^{19}$ ($cm^{-3}$)) GaN was formed as a second-conduction-type second cladding layer. Finally, 0.02-μm thick Mg-doped (Mg concentration=$1 \times 10^{20}$ ($cm^{-3}$)) GaN was formed as a second-conduction-type contact layer.

After that, the temperature was gradually lowered in an MOCVD growing furnace, and the wafer was unloaded from the furnace, thereby terminating epitaxial growth.

To form a p-type-side electrode on the wafer having undergone epitaxial growth, photolithography was used to make a preparation for pattering a p-type-side electrode by lift-off, and form a resist pattern. That is, to form a plurality of previously designed p-type-side electrodes, a Reuleaux triangle was used as each of a plurality of curve of constant width or constant-width figure portions, a plurality of extracting-electrode-portions were formed by combining rectangles, the width of each Reuleaux triangle was set at 500 µm, the length of a portion where a rectangular extracting-portion 1 forming a p-type-side electrode and close to the constant-width figure was in contact with the constant-width figure portion was set at 50 µm, and the width of the extracting-portion 1 was also set at 50 µm. To arrange the constant-width figures as densely as possible, the length in the longitudinal direction of a rectangular second-extracting-portion spaced apart from the constant-width figure was adjusted.

Then, 200-Å thick Pd and 10,000-Å thick Au were formed by vacuum evaporation, and unnecessary portions were removed in acetone by lift-off.

After that, the p-type-side electrodes were completed by annealing. In this case, no damage was inflicted on a p-type-side carrier-injecting-region, because the p-type-side electrode was formed without any plasma process or the like.

Subsequently, an etching mask was formed in order to perform a first etching step of exposing the first-conduction-type contact layer as a preparation for forming a first-conduction-type-side electrode. That is, an $SiN_x$ film was formed on the entire wafer surface by vacuum evaporation. The $SiN_x$ mask was patterned by performing photolithography again, thereby forming a first etching mask. As the first etching step, ICP plasma etching using $Cl_2$ gas was performed on the p-GaN contact layer, the p-GaN second-conduction-type cladding layer, the p-AlGaN first-conduction-type cladding layer, the active layer structure including the InGaN quantum well layers and GaN barrier layers, and the n-AlGaN first cladding layer, and to the middle of the n-GaN contact layer, thereby exposing the n-type contact layer as an n-type carrier-injecting-portion.

After ICP plasma etching was complete, the $SiN_x$ mask was entirely removed. Since Au was formed on the p-type-side electrode surface, the surface was not damaged at all by any of these processes in this case as well.

To form an n-type-side electrode, photolithography was used to make a preparation for patterning an n-type-side electrode by lift-off, and form a resist pattern. In this step, in a portion where an n-type-side electrode surrounded the Reuleaux triangle of the p-type-side electrode, the distance x shown in FIG. 7B, that is, the shortest distance from the portion, where the p-type-side electrode was in contact with the p-type-side contact layer to the portion, where an n-type-side electrode was in contact with the n-type-side contact layer, was set to be 75 µm.

As an n-type-side electrode, 200-Å thick Ti and 15,000-Å thick Al were formed on the entire wafer surface by vacuum evaporation, and unnecessary portions were removed in acetone by lift-off. After that, the n-type-side electrode was completed by annealing.

Then, as a preparation for substrate removal, the whole wafer having the light emitting device was mounted by using AuSn solder on a device-supporting-plate made of AlN and having Ti/Pt/Au metal interconnections formed on the surface. During mounting, the device-supporting-plate and the wafer having the light emitting device were heated to 300° C. so that the p-type-side electrodes and n-type-side electrodes were connected by AuSn solder to the respectively designed metal interconnections on the support.

Subsequently, substrate removal (laser debonding) was performed by emitting an excimer laser having a wavelength of 248 nm from the substrate surface on which no epitaxial growth was performed. After that, Ga generated when the GaN buffer layer was partially decomposed into nitrogen and Ga was removed by wet etching.

After the substrate was removed, a dicing-saw was used to cut the wafer having the device-supporting-plate and light emitting device in order to obtain a light emitting device including a desired number of constant-width figure portions by dividing the ultra-thin-film light emitting device mounted on the support by the metal solder. In this manner, a compound semiconductor light emitting device having a plurality of main-electrodes including curve of constant width or constant-width figure portions and a plurality of extracting-electrodes was completed. When carriers were injected into this device, light emitted from the p-type-side electrode in the main light extracting direction was uniform even although the size of the p-type-side electrode was large and the outer shape of the device was also large.

The invention claimed is:

1. A light emitting device having a first-conduction-type cladding layer, an active layer structure, and a second-conduction-type cladding layer, each of which comprises a III-V compound semiconductor, wherein said active layer structure is located between said first-conduction-type cladding layer and said second-conduction-type cladding layer, said light emitting device comprising:
   a first-conduction-type-side electrode configured to inject carriers into said first-conduction-type cladding layer; and
   a second-conduction-type-side electrode configured to inject carriers into said second-conduction-type cladding layer,
   wherein said first-conduction-type-side electrode has an opening, and said second-conduction-type-side electrode has a main-electrode-portion partially surrounded by said first-conduction-type-side electrode, and an extracting portion configured to extract said main-electrode-portion outside said first-conduction-type-side electrode through the opening, and
   said main-electrode-portion is a part of a curve of constant width or a constant-width figure, and an interval between an outer edge of said main-electrode-portion and an inner edge of said first-conduction-type-side electrode is substantially constant, wherein the curve of constant width or the constant-width figure comprises a Reuleaux polygon or Reuleaux triangle.

2. The light emitting device according to claim 1, wherein said active layer structure, said second-conduction-type cladding layer, and said second-conduction-type-side electrode are arranged on a surface of said first-conduction-type cladding layer in a first direction, and said first-conduction-type-side electrode is formed on the surface of said first-conduction-type cladding layer in the first direction to partially surround said active layer structure, said second-conduction-type cladding layer, and said second-conduction-type-side electrode.

3. The light emitting device according to claim 1, further comprising a support substrate,
   wherein said support substrate supports one of two surfaces, from which said first-conduction-type-side electrode and said second-conduction-type-side electrode are exposed, of a structure comprising said first-conduction-type cladding layer, said active layer structure, said second-conduction-type cladding layer, said first-conduction-type-side electrode, and said second-conduction-type-side electrode.

4. The light emitting device according to claim 1, wherein the curve of constant width or the constant-width figure includes a circle.

5. The light emitting device according to claim 1, wherein W is a width of said main-electrode-portion and W satisfies $$400 \text{ μm} \leq W \leq 2500 \text{ μm} \quad (1),$$

6. The light emitting device according to claim 1, wherein said extracting-portion comprises a portion which narrows toward said main-electrode-portion.

7. The light emitting device according to claim 1, wherein said extracting-portion comprises a rectangular portion.

8. The light emitting device according to claim 1, wherein W is a width of said main-electrode-portion and $L_1$ is a width of a portion where said main-electrode-portion and said extracting-portion are in contact with each other, and W and $L_1$ satisfy $$W/20 \leq L_1 \leq W \quad (2).$$

9. The light emitting device according to claim 1, wherein $L_2$ is an outer edge length of a portion of said second-conduction-type-side electrode which is surrounded by said first-conduction-type-side electrode and $L_3$ is an outer edge length of a portion of said second-conduction-type-side electrode which is a part of the curve of constant width or the constant-width figure, and $L_2$ and $L_3$ satisfy $$L_2/2 \leq L_3 \leq L_2 \quad (3).$$

10. The light emitting device according to claim 1, wherein x is the interval between the outer edge of said main-electrode-portion and the inner edge of said first-conduction-type-side electrode and x satisfies $$3 \text{ μm} \leq x \leq 500 \text{ μm} \quad (4).$$

11. The light emitting device according to claim 1, wherein said main-electrode-portion comprises a plurality of main-electrode-portions.

12. The light emitting device according to claim 1, wherein a peripheral portion of said second-conduction-type-side electrode is covered with an insulator.

13. The light emitting device according to claim 1, wherein said first-conduction-type-side electrode is configured to inject carriers into said first-conduction-type cladding layer through an opening formed in an insulator.

14. The light emitting device according to claim 12, wherein said insulator comprises at least one material selected from the group consisting of $SiO_x$, $AlO_x$, $TiO_x$, $TaO_x$, $HfO_x$, $ZrO_x$, $SiN_x$, $AlN_x$, $AlF_x$, $BaF_x$, $CaF_x$, $SrF_x$, and $MgF_x$.

15. The light emitting device according to claim 12, wherein said insulator comprises a plurality of layers.

16. The light emitting device according to claim 1, wherein each of said first-conduction-type cladding layer, said active layer structure, and said second-conduction-type cladding layer comprises an element selected from the group consisting of In, Ga, Al, B, and N.

17. The light emitting device according to claim 1, wherein said active layer structure comprises a quantum well layer and a barrier layer, B is the number of barrier layers and W is the number of quantum well layers, and B and W satisfy $$B = W + 1 \quad (5).$$

18. The light emitting device according to claim 1, further comprising a first-conduction-type contact layer between said first-conduction-type cladding layer and said first-conduction-type-side electrode.

19. The light emitting device according to claim 1, further comprising a second-conduction-type contact layer between said second-conduction-type cladding layer and said second-conduction-type-side electrode.

20. The light emitting device according to claim 1, wherein said first-conduction-type cladding layer comprises an n-type semiconductor layer and said second-conduction-type cladding layer comprises a p-type semiconductor layer.

* * * * *